(12) United States Patent
Horikawa

(10) Patent No.: US 9,590,154 B2
(45) Date of Patent: Mar. 7, 2017

(54) WIRING SUBSTRATE AND LIGHT EMITTING DEVICE

(71) Applicant: SHINKO ELECTRIC INDUSTRIES CO., LTD., Nagano-ken (JP)

(72) Inventor: Yasuyoshi Horikawa, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/459,621

(22) Filed: Aug. 14, 2014

(65) Prior Publication Data

US 2015/0060920 A1    Mar. 5, 2015

(30) Foreign Application Priority Data

Sep. 2, 2013  (JP) ................................. 2013-181378

(51) Int. Cl.

| H01L 33/60 | (2010.01) |
|---|---|
| H01L 33/62 | (2010.01) |
| H05K 1/02 | (2006.01) |
| H05K 1/18 | (2006.01) |

(Continued)

(52) U.S. Cl.
CPC .............. *H01L 33/60* (2013.01); *H01L 33/62* (2013.01); *H05K 1/187* (2013.01); *H05K 1/188* (2013.01); *H01L 25/167* (2013.01); *H01L 2224/45144* (2013.01); *H01L 2224/45147* (2013.01); *H01L 2224/48091* (2013.01); *H01L 2224/48228* (2013.01); *H01L 2224/73265* (2013.01); *H01L 2924/19107* (2013.01); *H05K 1/0274* (2013.01); *H05K 1/056* (2013.01); *H05K 2201/0376* (2013.01); *H05K 2201/10106* (2013.01);

(Continued)

(58) Field of Classification Search
CPC ......... H01L 33/56; H01L 33/48; H01L 33/00; H01L 33/60; H01L 33/62; H01L 2924/19107; H01L 2924/00014; H01L 2924/00; H01L 2224/48091; H01L 2224/73265; H01L 2224/48228; H01L 2224/45144; H01L 2224/45147; H01L 2201/10636; H01L 2201/10174; H01L 2201/10106; H01L 2201/0376; H05K 1/188; H05K 1/187
USPC ...................... 257/98, 99, E33.056; 361/761
See application file for complete search history.

(56) References Cited

U.S. PATENT DOCUMENTS

| 2006/0017133 A1* | 1/2006 | Oi ........................ H01L 21/6835 257/528 |
| 2013/0285254 A1* | 10/2013 | Kainuma ................ H01L 24/18 257/774 |
| 2014/0226290 A1* | 8/2014 | Hayashi ........................ 361/748 |

(Continued)

FOREIGN PATENT DOCUMENTS

| JP | 2010-129598 | 6/2010 |
| JP | 2012-015438 | 1/2012 |

*Primary Examiner* — Cuong Q Nguyen
*Assistant Examiner* — Tong-Ho Kim
(74) *Attorney, Agent, or Firm* — Fish & Richardson P.C.

(57) ABSTRACT

A wiring substrate includes an insulation layer, separated wires formed on a first surface of the insulation layer, a first plating layer formed on a first surface of each of the wires, a reflection layer including a first opening that exposes at least a portion of the first plating layer as a connection pad, and an electronic component mounted on a second surface of each of the wires, which is located on an opposite side of the first surface of each of the wires. The electronic component is embedded in the insulation layer.

11 Claims, 15 Drawing Sheets

(51) Int. Cl.
H01L 25/16 (2006.01)
H05K 1/05 (2006.01)
(52) U.S. Cl.
CPC .............. H05K 2201/10174 (2013.01); H05K 2201/10636 (2013.01); Y02P 70/611 (2015.11)

(56) References Cited

U.S. PATENT DOCUMENTS

2014/0264417 A1* 9/2014 Kobayashi et al. ............ 257/98

* cited by examiner

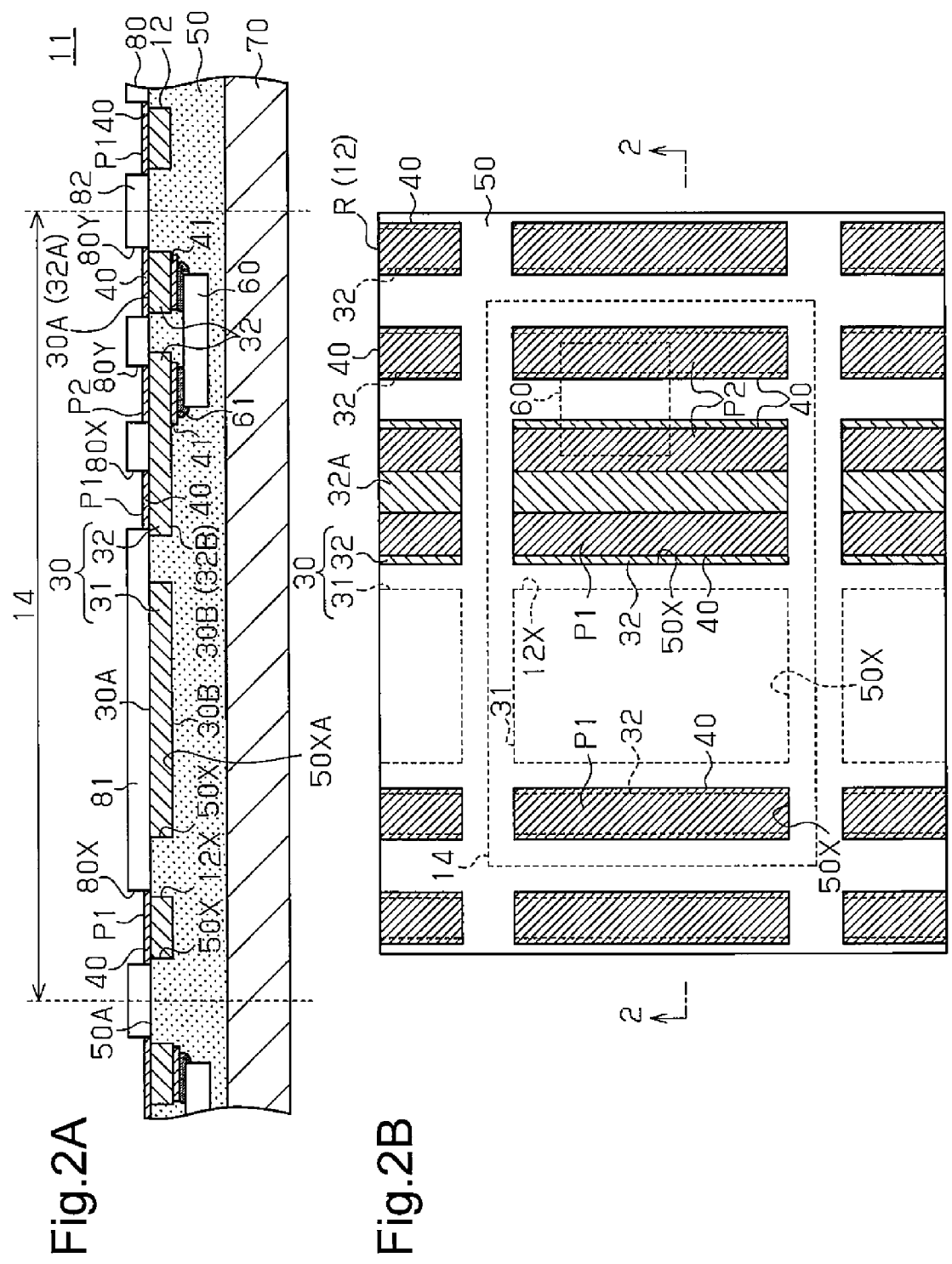

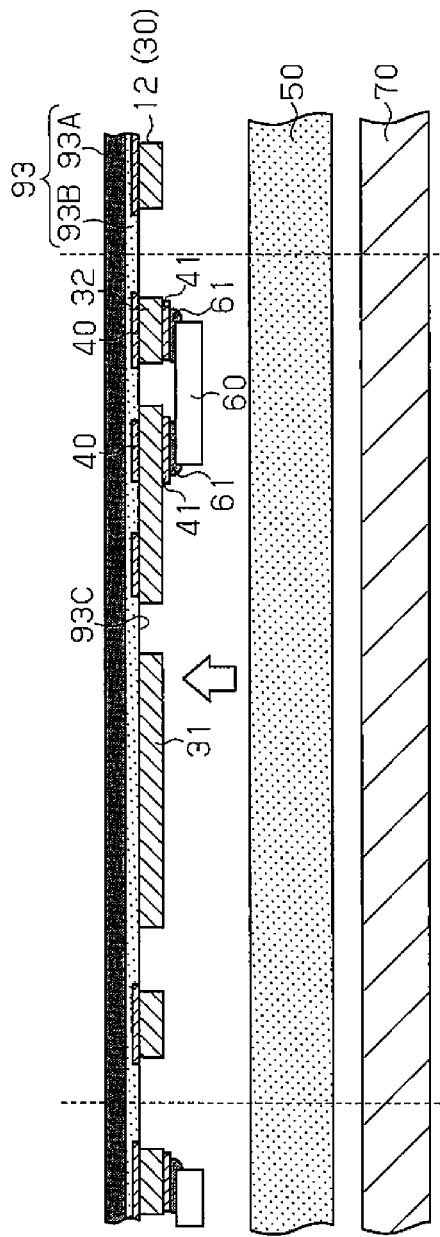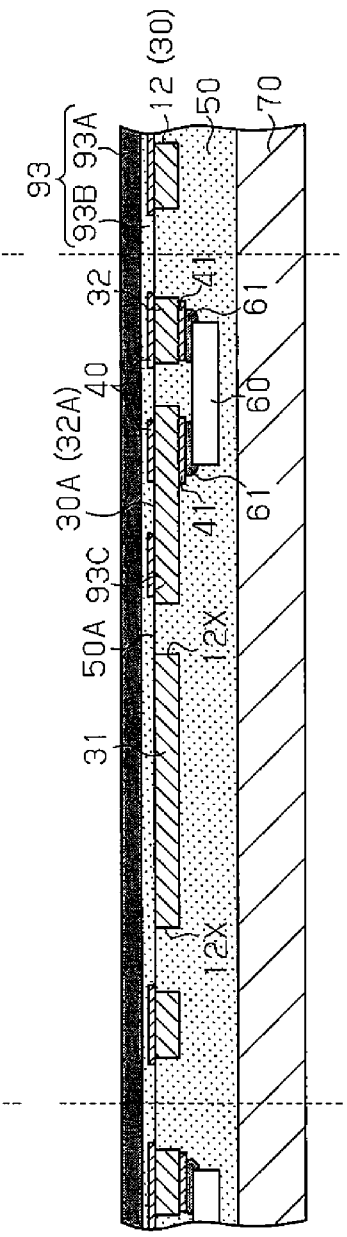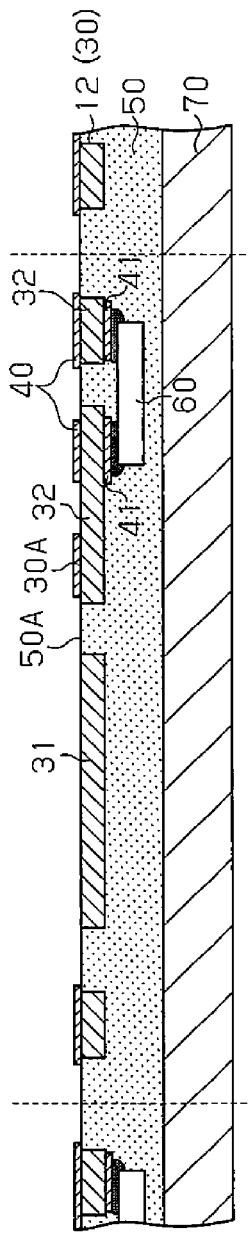

WIRING SUBSTRATE AND LIGHT EMITTING DEVICE

CROSS-REFERENCE TO RELATED APPLICATIONS

This application is based upon and claims the benefit of priority from prior Japanese Patent Application No. 2013-181378, filed on Sep. 2, 2013, the entire contents of which are incorporated herein by reference.

FIELD

The present disclosure relates to a wiring substrate, a light emitting device, and a method for manufacturing a wiring substrate.

BACKGROUND

Light emitting devices, which are formed by mounting light emitting elements on a substrate, have various shapes. Japanese Laid-Open Patent Publication No. 2010-129598 describes an example of a light emitting device. In the light emitting device, an insulation layer is formed on a metal substrate. A wiring layer is formed on the insulation layer. A light emitting element, such as a light emitting diode, is mounted on the wiring layer. Further, in the light emitting device, an electronic component other than a light emitting element (e.g., passive element) is mounted on a plane that is flush with a mounting surface on which the light emitting element is mounted.

SUMMARY

To efficiently use the light emitted from the light emitting element, the light emitting device includes a reflection film formed on the mounting surface. The reflection film reflects light emitted from the light emission element. However, a reflection film may not be formed in the region where the electronic component is mounted. This drastically decreases the reflectivity in the region where the electronic component is mounted compared to the region where the reflection film is formed.

One aspect of this disclosure is a wiring substrate including an insulation layer, a plurality of separated wires formed on a first surface of the insulation layer, a first plating layer formed on a first surface of each of the wires, a reflection layer including a first opening that exposes at least a portion of the first plating layer as a connection pad, and an electronic component mounted on a second surface of each of the wires, the second surface of each of the wires being located on an opposite side of the first surface of each of the wires, wherein the electronic component is embedded in the insulation layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2A is a cross-sectional view of a portion of the lead frame illustrated in FIG. 1 and taken along line 2-2 in FIGS. 1B and 2B;

FIG. 2B is an enlarged plan view of the region R illustrated in FIG. 1B from which an insulation layer is removed from an outermost surface;

FIGS. 5A to 5D, 6A to 6D, 7A to 7C, and 8A to 8C are cross-sectional views illustrating a process for manufacturing the light emitting device of the first embodiment;

DESCRIPTION OF THE EMBODIMENTS

Figure 1A:
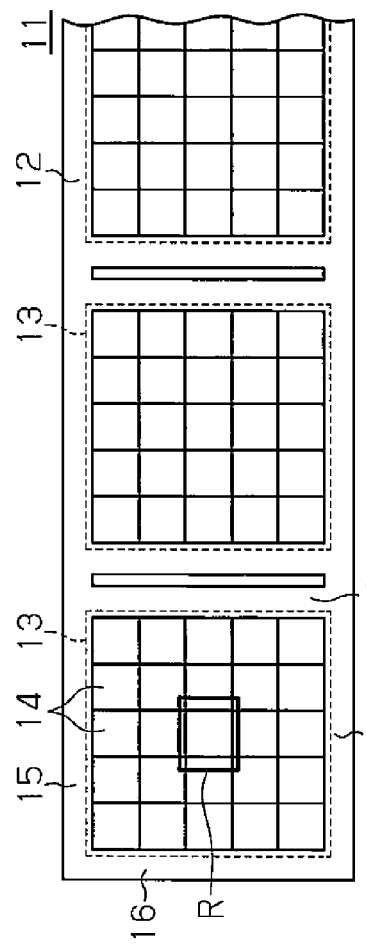
FIG. 1A is a schematic plan view illustrating a lead frame of a first embodiment.

Embodiments will now be described with reference to the accompanying drawings. In the drawings, elements have not necessarily been drawn to scale. To facilitate understanding, hatching lines may not be illustrated in the cross-sectional drawings.

A first embodiment will now be described with reference to FIGS. 1A to 8C.

Referring to FIG. 1A, a lead frame 11 includes a substrate frame 12, which is tetragonal as viewed from above. The substrate frame 12 may be formed from, for example, a metal having low electric resistance and low heat resistance. The material of the substrate frame 12 may be, for example, copper (cu), a Cu-based alloy, iron-nickel (Fe—Ni), or an Fe—Ni-based alloy. The substrate frame 12 may have a thickness of, for example, 20 μm to 150 μm.

The substrate frame 12 includes a plurality of (three in this example) separated resin-filled regions 13. Each resin-filled region 13 includes a matrix (five rows and five columns in this example) of unit lead frames 14. Each unit lead frame 14 is ultimately diced as a semiconductor device (package) including a semiconductor element such as a light emitting element. Two rails 15, which extend in the longitudinal direction (left-right direction in FIG. 1A), and two rails 16, which extend in the lateral direction (up-down direction in FIG. 1A), are formed along the periphery of each resin-filled region 13. When assembling the semiconductor device, a semiconductor element is mounted on each unit lead frame 14. Then, a batch molding process is performed on each resin-filled region 13 to resin-seal the resin-filled region 13.

Referring to FIG. 2A, each unit lead frame 14 serves as a wiring substrate and includes a plurality of (four in this example) wires 30 (leads), a plating layer 40, an insulation layer 50 formed between the wires 30, an electronic component 60, a metal plate 70, and an insulation layer 80.

Referring to FIG. 2B, each wire 30 is rectangular as viewed from above. The wires 30 are arranged in parallel next to one another at a central portion of the unit lead frame 14. The wires 30 are separated from one another by openings 12X. The openings 12X also separate the wires 30 of adjacent unit lead frames 14 from one another. In the same manner as the substrate frame 12, each wire 30 may have a thickness of, for example, 20 μm to 150 μm.

Figure 4:
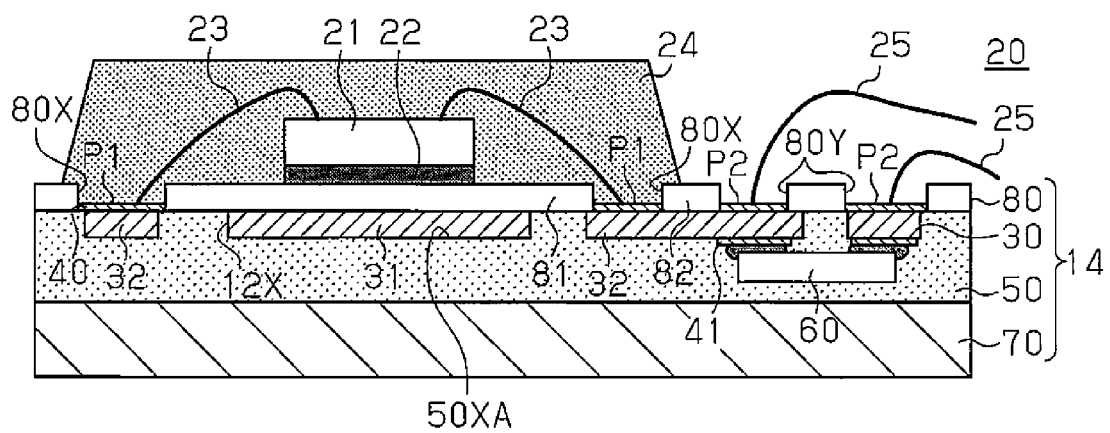
FIG. 4 is a schematic cross-sectional view illustrating a light emitting device using the unit lead frame of FIG. 3.

Referring to FIG. 4, the wires 30 includes a wire 31, which is formed in a light emitting element mounting region where a light emitting element 21 is mounted, and wires 32, which are located on opposite sides of the wire 31 as viewed from above.

Figure 1B:
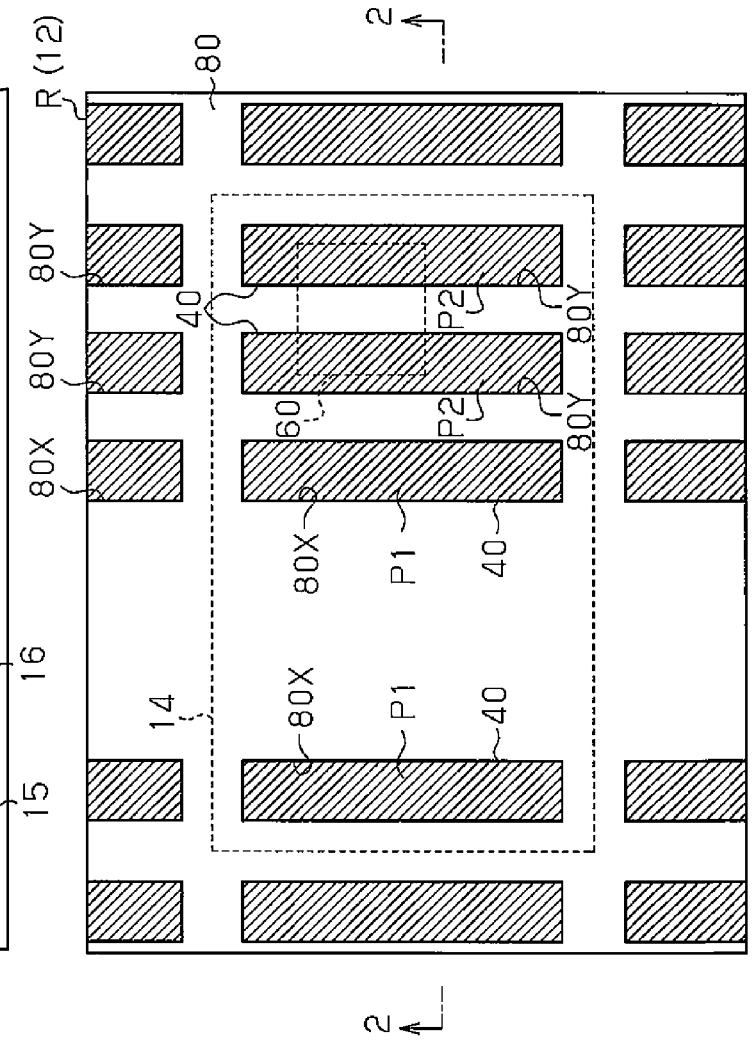
FIG. 1B is an enlarged plan view of region R illustrated in FIG. 1A.

Referring to FIG. 2A, a plating layer 40 is formed at certain locations on upper surfaces 32A of the wires 32. Referring to FIGS. 1B and 2B, each portion of the plating layer 40 on each upper surface 32A is, for example, rectangular as viewed from above. The upper surfaces 32A of the rightmost wire 32 and the leftmost wire 32 in the unit lead frame 14 are completely covered by portions of the plating layer 40 that are larger in size than these wires 32 as viewed from above.

As illustrated in FIG. 2A, a plating layer 41 is formed at certain locations on lower surfaces 32B of some of the wires 32, in the present embodiment, the two wires 32 located at the right side of the wire 31 in FIG. 2A. For example, the plating layer 41 is partially overlapped with the plating layer 40 as viewed from above. Although not illustrated in the drawings, each portion of the plating layer 41 is, for example, tetragonal as viewed from above.

The plating layers 40 and 41 function to improve, for example, the contact characteristics such as wire bonding characteristics and soldering characteristics. The plating layer 40 functions to suppress, for example, oxidation of the wires 30 during a heating process. Preferably, the plating layers 40 and 41 are formed from a metal having a higher corrosion resistance and a lower hardness than the wires 30. For example, a precious metal such as gold (Au) or silver (Ag) or a precious metal alloy including at least one of these precious metals may be used.

Specifically, the plating layers 40 and 41 may be, for example, metal layers formed by sequentially stacking an Ni layer and an Au layer on the upper surface 32A or the lower surface 32B of each wire 32. Examples of other metal layers includes metal layers formed by sequentially stacking an Ni layer, a palladium (Pd) layer, and an Au layer on the upper surface 32A or the lower surface 32B of each wire 32, metal layers formed by sequentially stacking an Ni layer, a Pd layer, and an Ag layer on the upper surface 32A or the lower surface 32B of each wire 32, and metal layers formed by sequentially stacking an Ni layer, a Pd layer, an Ag layer, and an Au layer on the upper surface 32A or the lower surface 32B of each wire 32. The Ni layer may be formed from Ni or an Ni alloy. The Au layer may be formed from Au or an Au alloy. The Pd layer may be formed from Pd or a Pd alloy. The Ag layer may be formed from Ag or an Ag alloy. In this manner, it is preferred that the outermost metal layer of the plating layers 40 and 41 be formed from a precious metal or a precious metal alloy.

In the present embodiment, the plating layer 40 is formed by sequentially stacking an Ni layer and an Au layer in this order on the upper surface 32A of the wire 32. In the same manner, the plating layer 41 is formed by sequentially stacking an Ni layer and an Au layer in this order on the lower surface 32B of the wire 32. In this case, the Ni layer may have a thickness of, for example, 0.1 μm to 3 μm, and the Au layer may have a thickness of, for example, 0.01 μm to 1 μm.

The electronic component 60 is mounted on the plating layer 41. Specifically, bonding members 61 bond the electronic component 60 to the lower surface of the plating layer 41. In other words, the electronic component 60 is mounted on the lower surfaces 32B of the wires 32. The upper surface 30A of each wire 30 is used as a mounting surface on which the light emitting element 21 is mounted (refer to FIG. 4). Accordingly, the electronic component 60 is mounted on the lower surfaces 32B of the wires 32 on the opposite side of the mounting surface of the light emitting element 21. For example, the bonding members 61 bond the electronic component 60 faced down to the lower surface of the plating layer 41 so that the circuit formation area (upper surface) of the electronic component 60 opposes the plating layer 41. This electrically connects electrodes (not illustrated) formed on the circuit formation surface of the electronic component 60 to the wires 32 through the bonding members 61 and the plating layer 41.

As illustrated in FIGS. 1B and 2B, the electronic component 60 is, for example, tetragonal, as viewed from above. For example, an electronic component other than a light emitting element may be used as the electronic component 60. Specifically, the electronic component 60 may be, for example, a passive element, such as a chip capacitor, a chip inductor, a chip resistor, or a Zener diode. The electronic component 60 may also be a power control semiconductor chip or the like. The bonding members 61 are conductive. For example, an anisotropic conductive resin or a conductive paste may be used as the bonding members 61.

As illustrated in FIG. 2A, the openings 12X extend through the substrate frame 12 in the thicknesswise direction. That is, the openings 12X extend from the upper surface 30A to the lower surface 30B of the wires 30. Walls defining the openings 12X, that is, side surfaces of the wires 30, set the thickness of the substrate frame 12.

The insulation layer 50 entirely coves the side surfaces of the wires 30. In other words, the openings 12X are filled with the insulation layer 50. Further, the insulation layer 50 entirely covers the lower surfaces 30B of the wires 30 and entirely covers the electronic component 60. For example, the insulation layer 50 covers the side surfaces and the lower surface of the plating layer 41 and also the bonding members 61. That is, the electronic component 60 is embedded (incorporated) in the insulation layer 50.

An upper surface 50A of the insulation layer 50 is substantially flush with the upper surfaces 30A of the wires 30. The upper surface 50A of the insulation layer 50 includes recesses 50X formed at certain locations. Each recess 50X extends from the upper surface 50A of the insulation layer 50 to an intermediate position of the insulation layer 50 in the thicknesswise direction. That is, each recess 50X includes a bottom surface 50XA located at an intermediate position in the thicknesswise direction of the insulation layer 50. As illustrated in FIG. 2B, like the wires 30, each recess 50X is, for example, rectangular as viewed from above. Further, as illustrated in FIG. 2A, the wire 30 is formed on the bottom surface 50XA (first surface of insulation layer 50) of the recess 50X, and the side surfaces of the wire 30 is covered by the insulation layer 50 that forms the side walls of the recess 50X. In this manner, the wires 30 are embedded in the insulation layer 50.

In this manner, the wires 30 are supported by the insulation layer 50. The insulation layer 50 functions to insulate the wires 30 and the metal plate 70 from each other and functions to adhere the wires 30 and the metal plate 70 to each other. Further, the insulation layer 50 functions to transmit heat, which is generated when the light emitting element 21 (refer to FIG. 4) mounted on the unit lead frame 14 emits light, to the metal plate 70. Accordingly, it is preferred that the material of the insulation layer 50 be an insulative resin having high thermal conductivity (e.g., 1 to 10 W/mK). For example, a resin material formed by mixing a filler of an inorganic material having high thermal conductivity (e.g., silica, alumina, or boron nitride) to an insulative resin such as a polyimide resin or an epoxy resin may be used as the material of the insulation layer 50. In this case, from the viewpoint of thermal conductivity, the content of the filler may be, for example, 50 to 80 vol %. Further, from the viewpoint of the insulation of the wires 30 and the metal plate 70, the thickness from the lower surfaces of the wires 30 to the lower surface of the insulation layer 50 may be, for example, 100 μm to 500 μm. When the insulation layer 50 is highly insulative, from the viewpoint of heat radiation, it is preferred that the insulation layer 50 be thin.

The metal plate 70 entirely covers the lower surface of the insulation layer 50. The metal plate 70 is adhered to the insulation layer 50. The metal plate 70 is, for example, a flat plate that is tetragonal as viewed from above. The surface of the metal plate 70 that contacts the insulation layer 50 may be a roughened surface.

The material of the metal plate 70 may be, for example, a metal having superior thermal conductivity, such as copper, aluminum (Al), or iron, or an alloy including at least one of these metals. Further, the material of the metal plate 70 may be, for example, a ceramic having superior thermal conductivity, such as aluminum nitride, silicon nitride, or alumina. To obtain high thermal conductivity, the metal plate 70 may have a thickness that is, for example, 100 μm to 2000 μm. The metal plate 70 functions as a support plate of the lead frame 11 and functions as a heat radiation plate that releases the heat generated when the light emitting element 21 (refer to FIG. 4) emits light. The light emitting efficiency of the light emitting element 21 (e.g., light emitting diode) has a tendency to decrease as the temperature rises. Thus, by efficiently releasing the heat of the light emitting element 21 with the metal plate 70, reduction in the light emitting efficiency of the light emitting element 21 may be limited.

The insulation layer 80 covers the upper surface 30A of each wire 30 and the upper surface 50A of the insulation layer 50. For example, the insulation layer 80 covers the upper surface 30A of each wire 30 and the upper surface 50A of the insulation layer 50 that are not covered by the plating layer 40. Thus, the insulation layer 80 includes openings 80X and 80Y that expose the plating layer 40. The openings 80X entirely expose two portions of the upper surface of the plating layer 40 located next to the wire 31 as connection pads P1. The connection pads P1 are electrically connected to the light emitting element 21 mounted on the light emitting element mounting region. The openings 80Y entirely expose two portions of the upper surface of the plating layer 40 located at the right side of the unit lead frame 14 as electrode terminals P2. The electrode terminals P2 are electrically connected to a mounting substrate (not illustrated). As illustrated in FIG. 1B, like the plating layers 40, each of the openings 80X and 80Y are rectangular as viewed from above. The insulation layer 80 may have a thickness of, for example, 10 μm to 30 μm. The insulation layer 80 functions to insulate adjacent wires 30 and functions to release the heat generated by the light emitting element 21.

The insulation layer 80 has high reflectivity. For example, it is preferred that the insulation layer 80 have reflectivity that is 50% or greater (preferably, 80% or greater) in a wavelength of 450 nm to 700 nm. The insulation layer 80 may be referred to as a white resist layer or a reflection layer. For example, a white insulative resin may be used as the material of the insulation layer 80. For example, a white insulative resin may be used by mixing a filler or pigment of white titanium oxide ($TiO_2$), barium sulfate ($BaSO_4$), alumina, or the like to a silicone resin. In this case, the content of the filler may be 50 vol % or greater. By covering the outermost surface of the unit lead frame 14 with the insulation layer 80 (white resist layer), the reflectivity of light from the light emitting element 21 mounted on the unit lead frame 14 may be increased, and the loss in the amount of light from the light emitting element 21 may be reduced.

A material having superior heat resistance may be used for the insulation layer 80. For example, a resin material including silicone may be used as the material of the insulation layer 80. Material using silicone as a basic frame has superior characteristics in which the heat resistance and the light resistance are high. Thus, such a material is suitable for the insulation layer 80 that is formed on the outermost surface of the lead frame 11.

As illustrated in FIG. 2A, the insulation layer 80 includes insulation layers 81 and 82. The insulation layer 81 covers the upper surface of the wire 31, the insulation layer 50 around the wire 31, and the upper surfaces of the wires 32. The insulation layer 82 covers the upper surfaces of the insulation layer 50 and the wires 32 that are not covered by the insulation layer 81 and the plating layer 40.

Figure 3:
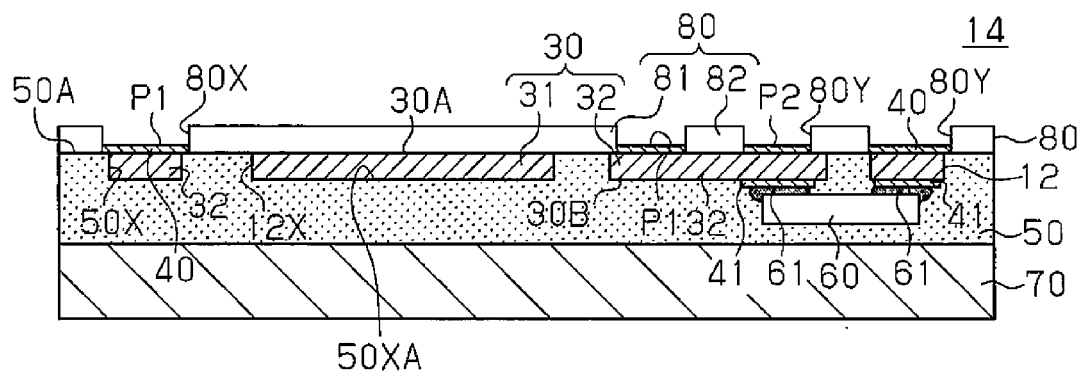
FIG. 3 is a schematic cross-sectional view illustrating a unit lead frame (wiring substrate) in the first embodiment.

Referring to FIG. 3, the insulation layers 50 and 80 and the metal plate 70 are diced at the positions indicated by broken lines in FIG. 2A to obtain the unit lead frame 14 (hereafter also referred to as the wiring substrate 14). The insulation layer 50, the metal plate 70, and the insulation layer 80 are exposed from the diced surfaces of the wiring substrate 14. That is, the wires 30 (substrate frame 12) are not exposed from the diced surfaces of the wiring substrate 14.

The structure of the light emitting device 20 will now be described with reference to FIG. 4.

The light emitting device 20 includes the wiring substrate 14, one or more light emitting elements 21 mounted on the wiring substrate 14, bonding wires 23, an encapsulation resin 24 encapsulating the light emitting element 21 and the bonding wires 23, and external connection wires 25.

The light emitting element 21 is mounted on the insulation layer 81 of the wiring substrate 14. The light emitting element 21 is adhered to the insulation layer 81 by an adhesive agent 22. Further, the light emitting element 21 includes electrodes (not illustrated) electrically connected to the connection pads P1 (plating layer 40) by the bonding wires 23. Thus, the light emitting element 21 is electrically connected to the wires 32 by the bonding wires 23 and the connection pads P1 (plating layer 40).

The plating layer 40 exposed from the openings 80Y of the insulation layer 80, namely, electrode terminals P2, are electrically connected to a mounting substrate (not illustrated) by the external connection wires 25. Such a connection supplies the light emitting element 21 with power from an external power supply (not illustrated) through the mounting substrate, the electrode terminals P2, the wires 32, and the like. When supplied with the power, the light emitting element 21 emits light.

For example, a light emitting diode (LED) or a vertical cavity surface emitting laser (VCSEL) may be used as the light emitting element 21. The bonding wires 23 and the external connection wires 25 may be formed by, for example, Au wires, aluminum (Al) wires, or Cu wires.

The encapsulation resin 24 is arranged on the upper surface of the wiring substrate 14 to encapsulate the light emitting element 21, the bonding wires 23, and the like. The encapsulation resin 24 does not encapsulate the electrode terminals P2 and the surrounding of the electrode terminals P2. For example, a resin material obtained by mixing a fluorescent substance in a silicone resin may be used as the material of the encapsulation resin 24. The formation of such a resin material including a fluorescent substance on the light emitting element 21 allows for the color of the light emitted from the light emitting element 21 to be mixed with the color of the light emitted from the fluorescent substance so that the light emitting device 20 may be controlled to emit various colors of light.

The operation of the wiring substrate 14 and the light emitting device 20 will now be described.

The electronic component 60 is mounted on the lower surfaces 32B of the wires 30 (wires 32) located on the opposite side of the upper surfaces 30A of the wires 30 (wires 31) serving as the mounting surface of the light emitting element 21. The electronic component 60 is incorporated in the insulation layer 50. This reduces the reflection blocked by the electronic component 60 of the light emitted from the light emitting element 21 mounted on the wiring substrate 14. Further, in comparison with when mounting the electronic component 60 on the mounting surface side, a large formation region may be obtained for the insulation layer 80 that has a high reflectivity. This limits decreases in the reflectivity of the light emitted from the light emitting element 21 in the wiring substrate 14.

The method for manufacturing the light emitting device 20 will now be described.

Figure 5A:
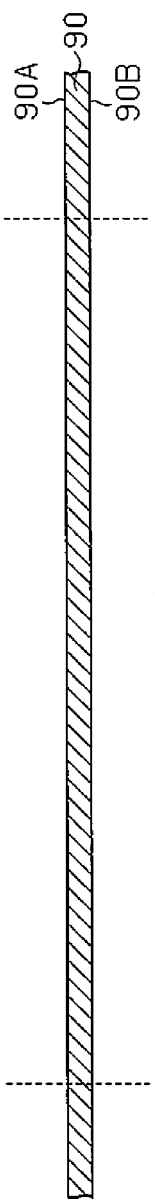

First, referring to FIG. 5A, a conductive substrate 90, which serves as a base material of the substrate frame 12, is prepared. The material of the conductive substrate 90 may be, for example, Cu, a Cu-based alloy, Fe—Ni, an Fe—Ni-based alloy, or the like. The conductive substrate 90 may have a thickness of, for example, 50 μm to 250 μm.

Figure 5B:
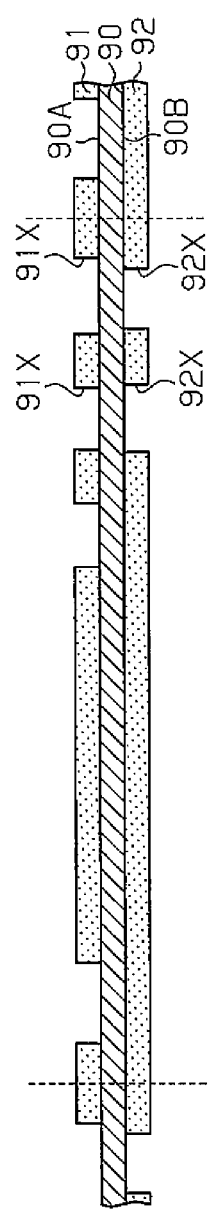

In the step illustrated in FIG. 5B, a resist layer 91 including opening patterns 91X at given locations is formed on an upper surface 90A of the conductive substrate 90. Further, a resist layer 92 including opening patterns 92X at given locations is formed on an lower surface 90B of the conductive substrate 90. When necessary, the upper surface 90A and the lower surface 90B of the conductive substrate 90 may be roughened, the resist layer 91 may be formed on the roughened upper surface 90A, and the resist layer 92 may be formed on the roughened lower surface 90B. The opening patterns 91X expose portions of the conductive substrate 90 corresponding to regions where the plating layer 40 is formed. The opening patterns 92X expose portions of the conductive substrate 90 corresponding to regions where the plating layer 41 is formed. The resist layers 91 and 92 may be formed from a material that is resistant to plating in a plating process performed in the next step. For example, the material of the resist layers 91 and 92 may be a photosensitive dry film resist (e.g., dry film resist of a novolac resin or an acrylic resin) or a liquid photoresist. For example, when using a photosensitive dry film resist, a dry film may be thermally compressed and laminated on the upper surface 90A and the lower surface 90B of the conductive substrate 90, and photolithography may be performed to pattern the dry film. This forms the resist layer 91, which includes the opening patterns 91X, and the resist layer 92, which includes the opening patterns 92X. When using a liquid photoresist, the same processes may be performed to form the resist layer 91.

Figure 5C:
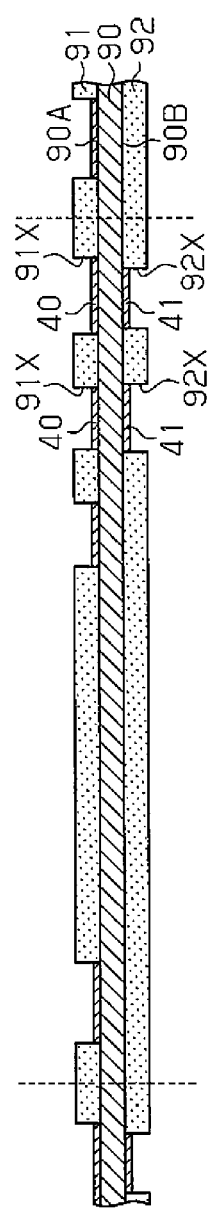

In the step illustrated in FIG. 5C, the resist layers 91 and 92 are used as masks to perform electrolytic plating with the conductive substrate 90 serving as a plating power supplying layer. For example, electrolytic plating is performed on the upper surface 90A of the conductive substrate 90 exposed from the opening patterns 91X of the resist layer 91 to form the plating layer 40 on the upper surface 90A of the conductive substrate 90. Further, electrolytic plating is performed on the lower surface 90B of the conductive substrate 90 exposed from the opening patterns 92X of the resist layer 92 to form the plating layer 41 on the lower surface 90B of the conductive substrate 90. When the plating layers 40 and 41 are, for example, Ni/Au layers, electrolytic plating is performed to sequentially stack an Ni layer and an Au layer on the upper surface 90A and the lower surface 90B exposed from the openings 91X and 92X of the resist layers 91 and 92, respectively. Then, for example, an alkali defoliation liquid is used to remove the resist layers 91 and 92.

Figure 5D:
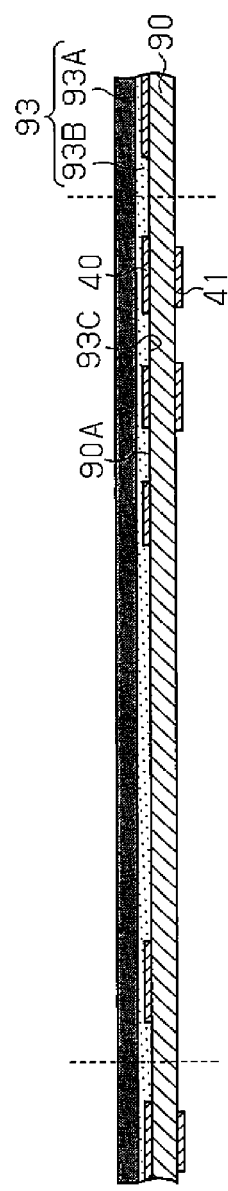

In the step illustrated in FIG. 5D, a tape 93 is applied to the upper surface 90A of the conductive substrate 90. For example, the tape 93 is formed by a film of a tape base 93A and an adhesive agent 93B applied to one surface of the tape base material 93A. In this case, a surface 93C of the adhesive agent 93B is applied to the upper surface 90A of the conductive substrate 90. For example, the tape 93 may be formed from a material having superior chemical resistance or superior heat resistance. Further, it is preferred that a material having satisfactory workability be used for the tape base 93A. For example, a polyimide resin or a polyester resin may be used as the material of the tape base 93A. It is preferred that a material that can easily be removed from the insulation layer 50 (refer to FIG. 2A) in a subsequent step be used as the adhesive agent 93B. For example, a silicone, acrylic, or olefin adhesive material may be used as the adhesive agent 93B. The tape base 93A may have a thickness of, for example, 20 μm to 50 μm, and the adhesive agent 93B may be thicker than, for example, the plating layer 40. For example, the plating layer 40 may have a thickness of 1 μm to 11 μm, and the adhesive agent 93B may have a thickness of 20 μm to 30 μm. By setting the thickness in such a manner, for example, when thermally compressing and laminating the sheet of the tape 93 on the upper surface 90A of the conductive substrate 90, the plating layer 40 is pressed into the adhesive agent 93B. This covers the entire side surfaces and the entire upper surface of the plating layer 40. In this manner, by pressing the plating layer 40 into the adhesive agent 93B, the adhesive agent 93B absorbs the irregularities resulting from the plating layer 40 in the upper surface 90A of the conductive substrate 90. This limits decreases in the adhesive force that would be caused by such irregularities between the tape 93 and the conductive substrate 90.

Figure 6A:
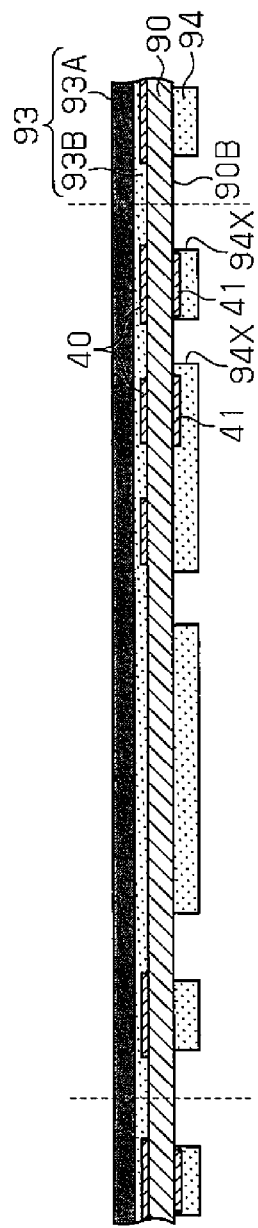

In the step illustrated in FIG. 6A, a resist layer 94 including openings 94X corresponding to the shapes of the openings 12X is formed on the lower surface 90B of the conductive substrate 90. The resist layer 94 may be formed from a material that is resistant to etching in an etching process performed in the next step. For example, the material of the resist layer 94 may be a photosensitive dry film resist (e.g., dry film resist of a novolac resin or an acrylic resin) or a liquid photoresist. When using a photosensitive dry film resist, a dry film is thermally compressed and laminated on the lower surface 90B of the conductive substrate 90, and the dry film is patterned by undergoing exposure and development to form the resist layer 94. When using a liquid photoresist, the same processes may be performed to form the resist layer 94.

Figure 6B:
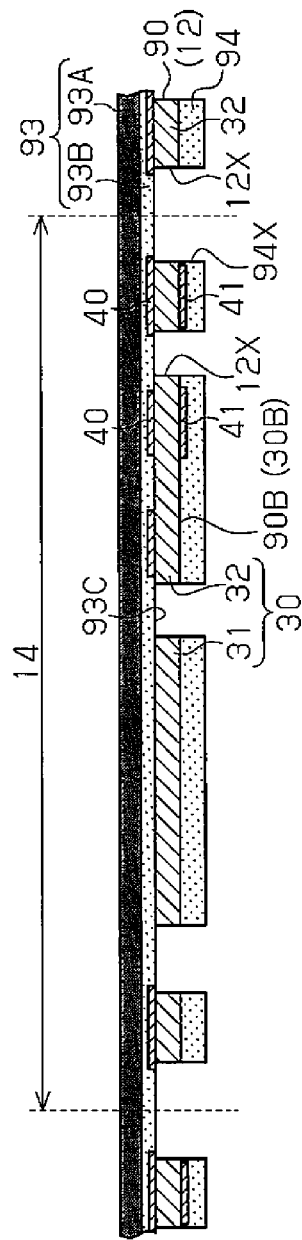

In the step illustrated in FIG. 6B, the conductive substrate 90 is etched from the lower surface 90B using the resist layer 94 as an etching mask to form the substrate frame 12. The etching from the lower surface 90B of the conductive substrate 90, which is exposed from the openings 94X of the resist layer 94, forms the openings 12X in the conductive substrate 90. The formation of the openings 12X defines the wires 30 in each unit lead frame 14. When performing wet etching (isotropic etching) to pattern the conductive substrate 90, the etching liquid used for the wet etching may be selected in accordance with the material of the conductive substrate 90. For example, when the conductive substrate 90 is formed from copper, aqueous ferric chloride may be used as the etching liquid. In this case, the patterning may be performed by spray etching the lower surface 90B of the conductive substrate 90. In the step of FIG. 6B, the tape 93 and the plating layer 40 function as an etching stopper layer.

Figure 6C:
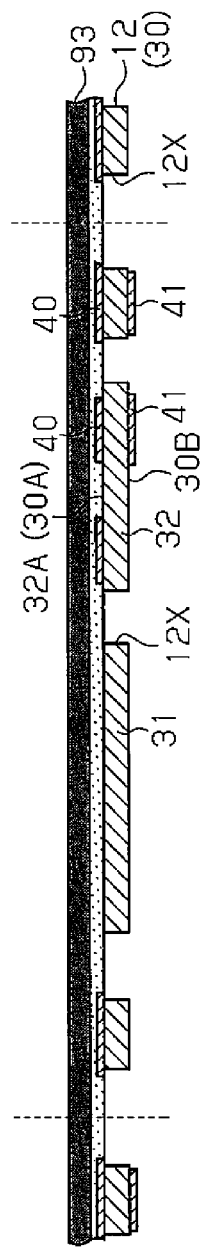

In the step illustrated in FIG. 6C, for example, an alkali defoliation liquid is used to remove the resist layer 94 illustrated in FIG. 6B. This exposes the lower surfaces 30B of the wires 30, which are located on the opposite side of the mounting surface of the light emitting element 21 (upper surfaces 30A of the wire 30), and the lower surface of the plating layer 41 formed on the lower surfaces 30B.

Figure 6D:
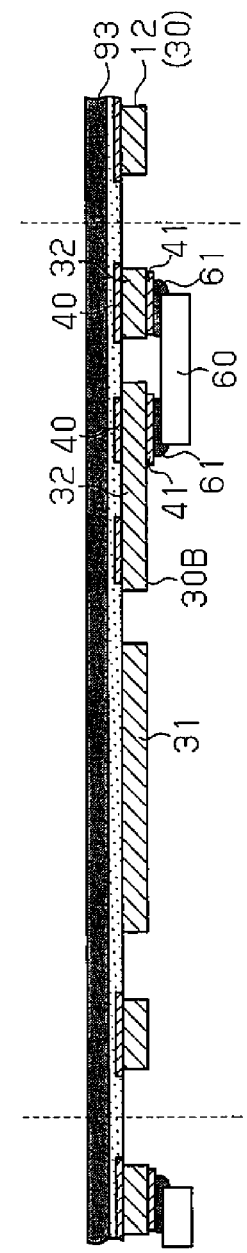

In the step illustrated in FIG. 6D, the electronic component 60 is mounted on the lower surface of the plating layer 41. For example, the electronic component 60 is bonded faced down to the lower surface of the plating layer 41 so that the circuit formation area (upper surface in FIG. 6D) of the electronic component 60 opposes the plating layer 41. For example, the bonding members 61 are applied in advance to the lower surface of the plating layer 41, and the electronic component 60 arranged faced down on the lower surface of the plating layer 41 is heated and pressurized to bond the electronic component 60 to the lower surface of the plating layer 41 with the bonding member 61. Here, the bonding members 61 electrically connect the electrodes (not illustrated) formed on the circuit formation surface of the electronic component 60 to the plating layer 41. In the step of FIG. 6D, for example, an anisotropic conductive film (ACF) or an anisotropic conductive paste (ACP) may be used as the bonding members 61. In this case, ACP and ACF are formed by spreading resin pellets coated by Ni/Au in an insulative resin such as an epoxy resin or a cyanate ester and are conductive in a vertical direction and insulative in a horizontal direction. When using ACF or ACP as the bonding member 61, the bonding members 61 (ACF or ACP) are strongly pressurized between the plating layer 41 and the electronic component 60 so that the bonding member 61 becomes conductive in the thicknesswise direction. This electrically connects the plating layer 41 and the electronic component 60 through the bonding members 61.

In the steps illustrated in FIGS. 7A and 7B, the wires 30, the plating layer 41, the bonding members 61, and the insulation layer 50 that covers the electronic component 60 are stacked on the surface 93C of the tape 93. Further, the metal plate 70 is stacked on the insulation layer 50. The stacking of the insulation layer 50 and the metal plate 70 will now be described.

First, as illustrated in FIG. 7A, the insulation layer 50 and the metal plate 70 are prepared. In this step, the insulation layer 50 is in a B-stage (semi-cured). The viscosity of the insulation layer 50 is adjusted, for example, so that the openings 12X are filled with the insulation layer 50 and so that the wires 30, the electronic component 60, and the like are entirely covered by the insulation layer 50. The insulation layer 50 has, for example, a thickness that completely closes the openings 12X and entirely covers the wires 30, the electronic component 60, and the like. For example, the insulation layer 50 has a thickness of 150 μm to 750 μm.

Then, referring to FIG. 7A, the insulation layer 50 and the metal plate 70 are arranged in this order on the lower side of the structure illustrated in FIG. 6D. The structure of FIG. 6D, the insulation layer 50, and the metal plate 70 are heated and pressurized in a vacuum atmosphere at a temperature of 80° C. to 200° C. As illustrated in FIG. 7B, this fills the openings 12X with the insulation layer 50. As a result, the insulation layer 50 covers the wires 30, the plating layer 41, the bonding members 61, and the electronic component 60. That is, the wires 30, the plating layer 41, the bonding members 61, and the electronic component 60 are embedded in the insulation layer 50. Then, the insulation layer 50 is cured (thermally hardened) and hardened under a temperature atmosphere of approximately 150° C. The hardening adheres the insulation layer 50 to the wires 30 and the insulation layer 50 to the metal plate 70. As a result, the insulation layer 50 and the metal plate 70 are stacked on the surface 93C of the tape 93. Here, the upper surfaces 30A of the wires 30 and the upper surface 50A of the insulation layer 50, which are in contact with the surface 93C of the tape 93, are shaped along the surface 93C of the tape 93 (flat surface). Thus, the upper surfaces 30A of the wires 30 and the upper surface 50A of the insulation layer 50 are flat.

For example, a resin molding process may be performed to stack the insulation layer 50 and the metal plate 70. When using a molding resin having a thermosetting property as the material of the insulation layer 50, the structure illustrated in FIG. 6D and the metal plate 70, which is separated from the structure by a given distance, are set in a mold. The resin-filled regions 13 (refer to FIG. 1A) are filled with the molding resin from a gate (not illustrated) while heating and pressurizing the molding resin. Referring to FIG. 7B, this forms the insulation layer 50 between the wires 30 and the metal plate 70 so as to fill the openings 12X and entirely cover the wires 30 and the electronic component 60. As a result, the insulation layer 50 and the metal plate 70 are stacked on the surface 93C of the tape 93. The openings 12X may be filled with the molding resin by performing, for example, transfer molding or injection molding.

The shape and size as viewed from above of the insulation layer 50 and the metal plate 70 are, for example, set to be substantially the same as the shape and size as viewed from above of the resin-filled regions 13 (refer to FIG. 1A).

In the step illustrated in FIG. 7C, the tape 93 illustrated in FIG. 7B is removed. In this stage, there may be residues of some of the adhesive agent 93B (refer to FIG. 7B) of the removed tape 93 on the upper surfaces 30A of the wires 30. Thus, for example, asking (dry etching using oxygen plasma) or blasting may be performed to remove the residues of the adhesive agent 93B. The removal of the tape 93 exposes the upper surfaces 30A of the wires 30 and the upper surface 50A of the insulation layer 50 that have been flattened as described above.

Figure 8A:
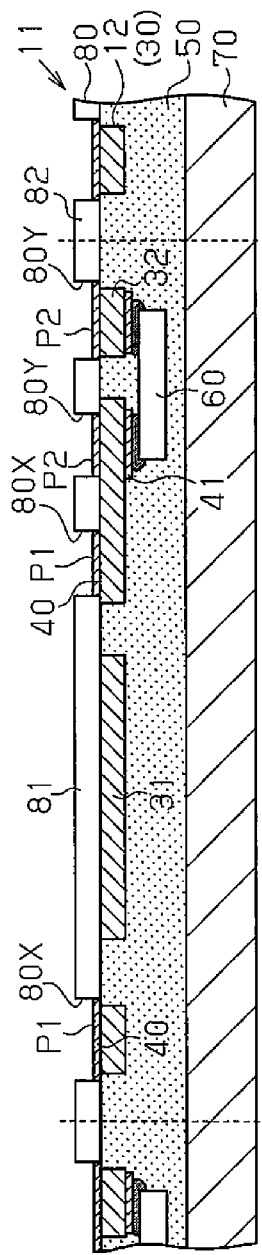

In the step illustrated in FIG. 8A, the insulation layer 80 including the openings 80X and 80Y respectively corresponding to the connection pads P1 and the electrode terminals P2 are formed on the wires 30 and the insulation layer 50. The insulation layer 80 (insulation layers 81 and 82) may formed, for example, by performing screen printing with a resin paste. Alternatively, the insulation layer 80 may be formed by applying a liquid resin with an injector (dispenser). When using a photosensitive, insulative resin as the material of the insulation layer 80, photolithography may be performed to form the insulation layer 80 that includes the openings 80X and 80Y.

Then, the insulation layer 80 is cured (thermally hardened) and hardened under a temperature atmosphere of approximately 150° C.

The formation of the insulation layer 80 (insulation layers 81 and 82) exposes a portion of the plating layer 40 from the openings 80X as the connection pads P1 and exposes the remaining portions of the plating layer 40 from the openings 80Y as the electrode terminals P2. Thus, after the formation of the insulation layer 80, there is no need to perform electrolytic plating on the wires to improve the contact characteristics.

The manufacturing steps described above form the structure of a matrix of the unit lead frames 14 (wiring substrates) that are connected to one another, namely, the lead frame 11 illustrated in FIGS. 1A and 2A.

Figure 8B:
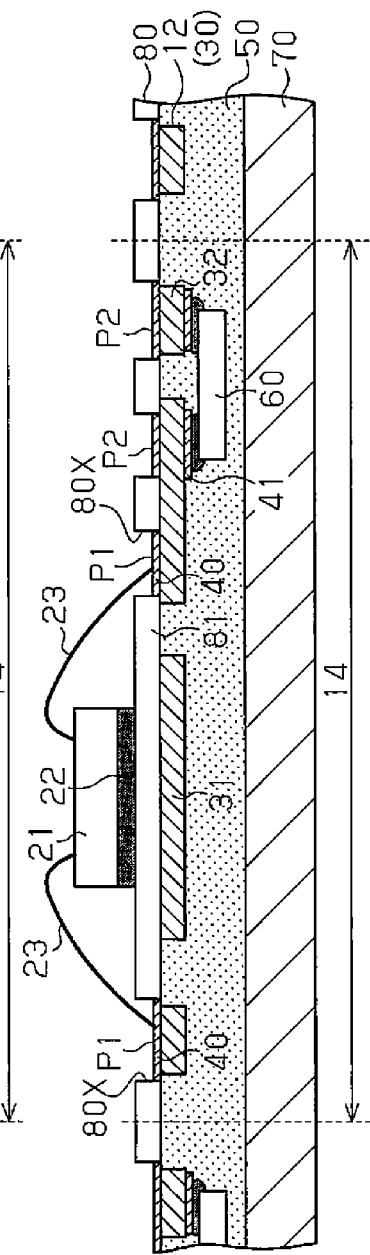

In the step illustrated in FIG. 8B, one or more light emitting elements 21 are wire-bonded to each unit lead frame 14. First, each light emitting element 21 is mounted on the insulation layer 81 where the light emitting element mounting region of each unit lead frame 14 is formed with the adhesive agent 22. Then, the electrodes (not illustrated) of the light emitting element 21 is connected by the bonding wires 23 to the plating layer 40 (i.e., connection pads P1) exposed from the openings 80X of the insulation layer 80. This electrically connects the electrodes of the light emitting element 21 to the wires 32 (connection pads P1).

Figure 8C:
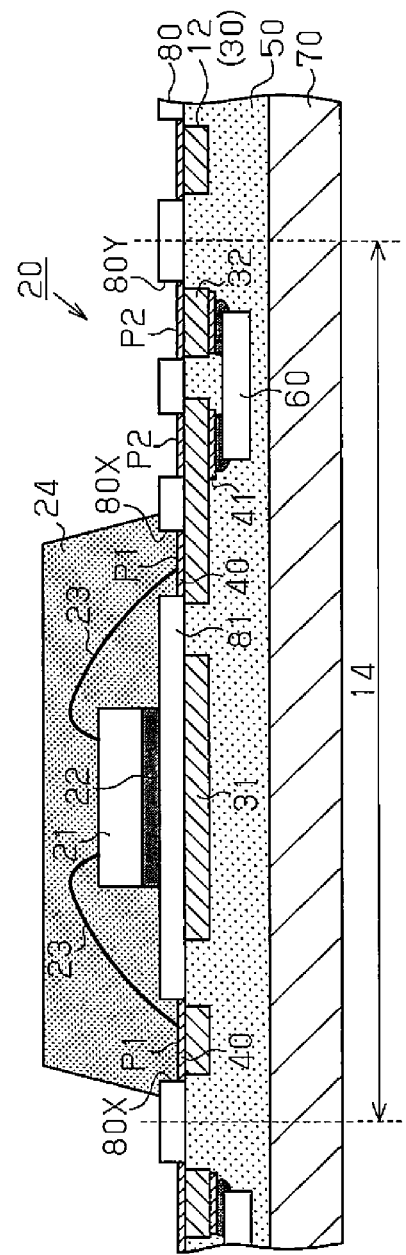

In the step illustrated in FIG. 8C, the encapsulation resin 24 is formed to encapsulate the light emitting element 21 and the bonding wires 23. For example, batch molding is performed for each resin-filled region 13 such that the encapsulation resin 24 encapsulates a portion of the surface (upper surface in FIG. 8C) of the lead frame 11 at the side where the light emitting element 21 is mounted. As a result, the encapsulation resin 24 encapsulates the light emitting element 21 and the bonding wires 23 that are mounted on each unit lead frame 14. Although not illustrated in the drawings, the encapsulation step is performed using, for example, upper and lower molds. First, the structure illustrated in FIG. 8B is set on the lower mold. Then, the upper mold is arranged on the lower mold, and an insulative resin is injected into the molds from a mold gate (not illustrated) to fill the resin-filled region 13 (refer to FIG. 1A) with the insulative resin. During this process, the molds are heated and pressurized. For example, the encapsulation resin 24 may be formed from a molding resin by performing transfer molding, compression molding, injection molding, or the like.

Then, the insulation layers 50 and 80 and the metal plate 70 are cut by a dicing blade or the like at the cutting positions indicated by the broken lines illustrated in FIG. 2A. This manufactures the light emitting devices 20 in a batch with the light emitting elements 21 mounted on the unit lead frame 14. When mounting each light emitting device 20 on a mounting substrate, the external connection wires 25 are connected to the electrode terminals P2.

The first embodiment has the advantages described below.

(1) The electronic component 60 is mounted on the lower surfaces 32B of the wires 30 (wires 32) located at the opposite side of the upper surface 30A of the wire 30 (wire 31) which serves as a mounting surface of the light emitting element 21. Further, the electronic component 60 is incorporated in the insulation layer 50. This reduces the reflection blocked by the electronic component 60 of the light emitted from the light emitting element 21 mounted on the wiring substrate 14. Further, in comparison with when mounting the electronic component 60 on the mounting surface side, a wide formation region may be obtained for the insulation layer 80 that has a high reflectivity. This limits decreases in the reflectivity of the light emitted from the light emitting element 21 in the wiring substrate 14. In other words, the light emitted from the light emitting element 21 is efficiently emitted toward the outer side, and the light emitting efficiency of the light emitting device 20 may be improved.

(2) The electronic component 60 is located at a position overlapped with the electrode terminals P2, which are used to connect the external connection wire 25. This allows for the wiring substrate 14 to be reduced in size compared to when the electronic component 60 is located at a position that is not overlapped with the electrode terminals P2.

(3) The plating layer 41 is formed on the lower surfaces 32B of the wires 32. Further, the electronic component 60 is bonded to the lower surfaces 32B of the wires 32 by the bonding members 61. This improves the contact characteristics of the bonding members 61 and the plating layer 41 (wires 32) compared to when the electronic component 60 is bonded to the lower surfaces 32B of the wires 32 by the bonding members 61.

(4) The light emitting element 21 is mounted on the insulation layer 81 which has a high reflectivity. This improves the light emitting efficiency of the light emitting element 21.

(5) The wire 31 is formed immediately below the insulation layer 81 on which the light emitting element 21 is mounted. This allows the heat generated from the light emitting element 21 to be released from the insulation layer 81 to the metal plate 70 through the wire 31 and the insulation layer 50. The wire 31 has higher thermal conductivity than the insulation layer 50. Thus, compared to when the insulation layer 81 is directly formed on the insulation layer 50, the heat generated from the light emitting element 21 may be efficiently released to the metal plate 70. This limits decreases in the light emitting efficiency of the light emitting element 21.

(6) After forming the plating layer 40 on the upper surface 32A of the wires 32 by performing electrolytic plating, the insulation layer 80 having the openings 80X and 80Y that expose the plating layer 40 is formed. In this case, the insulation layer 80 is not formed when the plating layer 40 is formed by performing electrolytic plating. This obviates the deterioration of the plating solution that would be caused by the existence of the insulation layer 80. After forming the insulation layer 80, plating (electrolytic plating or electroless plating) may be performed on the wires 30 exposed from the openings 80X and 80Y. However, this would dissolve the resin material or the like from the insulation layer 80. Thus, the plating solution may be deteriorated, and the life of the plating solution may thus be shortened. In contrast, the manufacturing method of the present embodiment does not form the insulation layer 80 when performing electrolytic plating. Thus, the problems described above may be obviated. That is, deterioration of the plating solution may be limited. This allows the life of the plating solution to be prolonged and allows for the plating solution to be continuously used. As a result, costs may be reduced.

Further, in the manufacturing method of the present embodiment, the insulation layer 80 is not immersed into a plating solution contained in a plating tank when performing electroless plating or electrolytic plating. This obviates the permeation of the plating solution into the insulation layer 80. Thus, a decrease in the reflectivity of the insulation layer 80 may be limited.

(7) The insulation layer 50 is formed to entirely cover the side surfaces of each wire 30, and the insulation layer 50 is supported by each wire 30. This allows support bars, section bars, and the like to be omitted that are used in the conventional lead frame to support wires (leads). Thus, when cutting the insulation layers 50 and 80 and the metal plate 70 at the positions indicted by the broken lines in FIG. 2A to obtain the unit lead frame 14, the wires 30 (substrate frame 12) are not exposed from the cut surface. This reduces oxidation of the wires 30.

Further, in the obtained unit lead frame 14, the side surfaces of the wires 30 are entirely covered by the insulation layer 50. This improves the insulation reliability of the unit lead frame 14 and the light emitting device 20, which uses the unit lead frame 14.

(8) When the tape 93 is applied to the conductive substrate 90, the conductive substrate 90 is patterned to form the substrate frame 12 (wires 30). Thus, even when etching is performed to leave only the wires 30, the tape 93 holds the wires 30. This allows support bars, section bars, and the like that are used in the conventional lead frame to support wires to be omitted. Further, the insulation layer 50 is formed to encapsulate the wires 30 held by the tape 93. Then, the tape 93 is removed. Thus, even after removing the tape 93, the insulation layer 50 holds (supports) the wires 30 at the given locations. Accordingly, the section bars and support bars used to support wires may be omitted.

The first embodiment may be modified as described below.

Figure 9A:
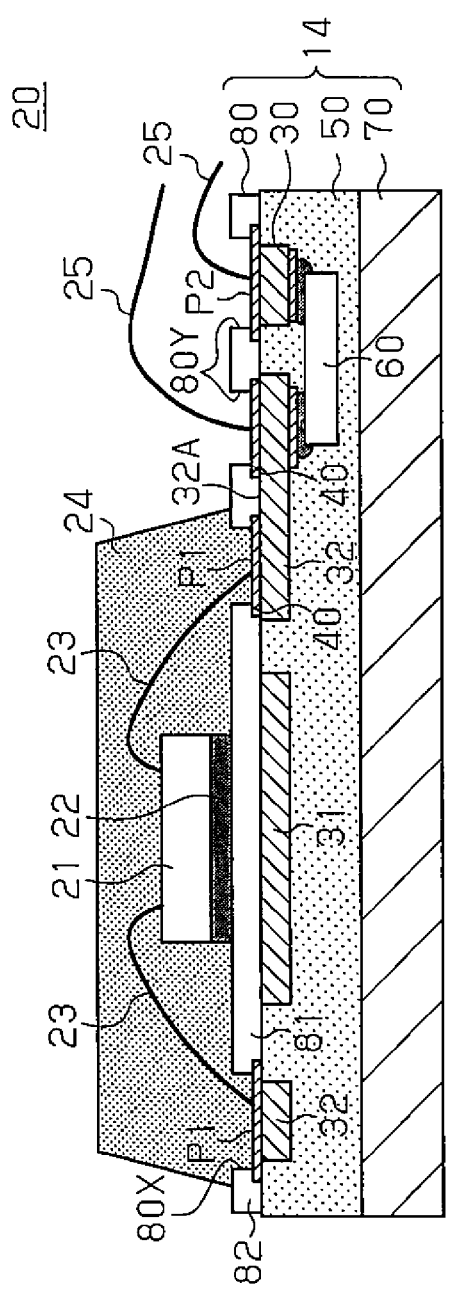
FIG. 9A is a schematic cross-sectional view illustrating a modified example of the light emitting device.

The shape of the insulation layer 80 is not particularly limited. For example, in the first embodiment, the insulation layer 80 is formed to entirely expose the upper surface of the plating layer 40. However, for example, as illustrated in FIG. 9A, the insulation layer 80 (insulation layers 81 and 82) may be formed to partially cover the upper surface of the plating layer 40.

Further, in the first embodiment, the outer side surfaces of the insulation layer 80 (insulation layer 82) is flush with the outer side surfaces of the insulation layer 50 and the metal plate 70. Instead, for example, as illustrated in FIG. 9A, the outer side surfaces of the insulation layer 80 (insulation layer 82) may be located at the inner side of the insulation layer 50 and the metal plate 70.

In the first embodiment and the modified examples, the plating layer 40 does not necessarily have to be formed on the upper surfaces 32A of the wires 32.

Figure 9B:
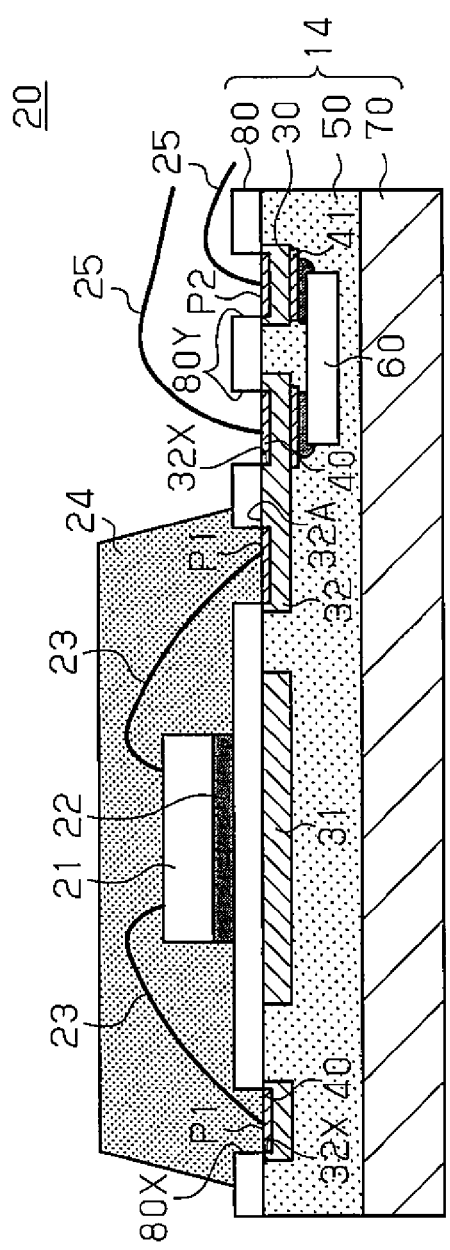
FIG. 9B is a schematic cross-sectional view illustrating a further modified example of the light emitting device.

For example, as illustrated in FIG. 9B, a recess 32X may be formed in the upper surface 32A of each wire 32, and the plating layer 40 may be formed on the bottom surface (first surface) of the recess 32X. The recess 32X is formed to extend from the upper surface 32A of the wire 32 to an intermediate position of the wire 32 in the thicknesswise direction. That is, the bottom surface of the recess 32X is formed at an intermediate position in the thicknesswise direction of the wire 32. The plating layer 40 is formed in the recess 32X of the wire 32. Thus, in the structure illustrated in FIG. 9B, the side surfaces of the plating layer 40 are covered by the wires 32 where the side walls of the recess 32X are formed. In this manner, the plating layer 40 may be embedded in the wire 32. The upper surface of the plating layer 40 may be flush with the upper surface 32A of the wire 32. Alternatively, the upper surface of the plating layer 40 may be located above the upper surface 32A of the wire 32. As another option, the upper surface of the plating layer 40 may be formed at a lower position than the upper surface 32A of the wire 32.

A second embodiment will now be described with reference to FIGS. 10 to 15. Like or same reference numerals are given to those components that are the same as the corresponding components of the first embodiment.

Figure 10:
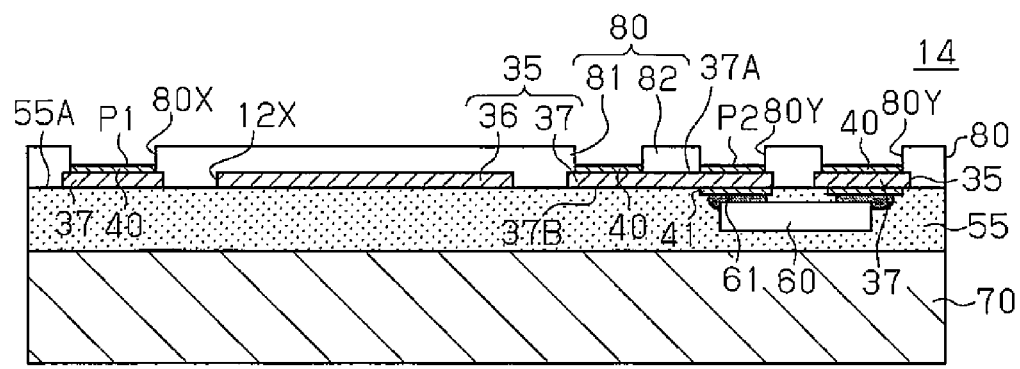
FIG. 10 is a schematic cross-sectional view illustrating a unit lead frame (wiring substrate) of a second embodiment.

Referring to FIG. 10, a wiring substrate (unit lead frame) 14 includes a plurality of (four in this example) wires 35, a plating layer 40, and insulation layer 55, an electronic component 60, a metal plate 70, and an insulation layer 80.

The wires 35 are stacked on the upper surface 55A of the insulation layer 55. In the same manner as the wires 30 of the first embodiment, each wire 35 is, for example, rectangular as viewed from above. The wires 35 are arranged in parallel next to one another. Openings 12X separate the wires 35 from one another. Each wire 35 may have a thickness of, for example, 50 μm to 250 μm.

Figure 11:
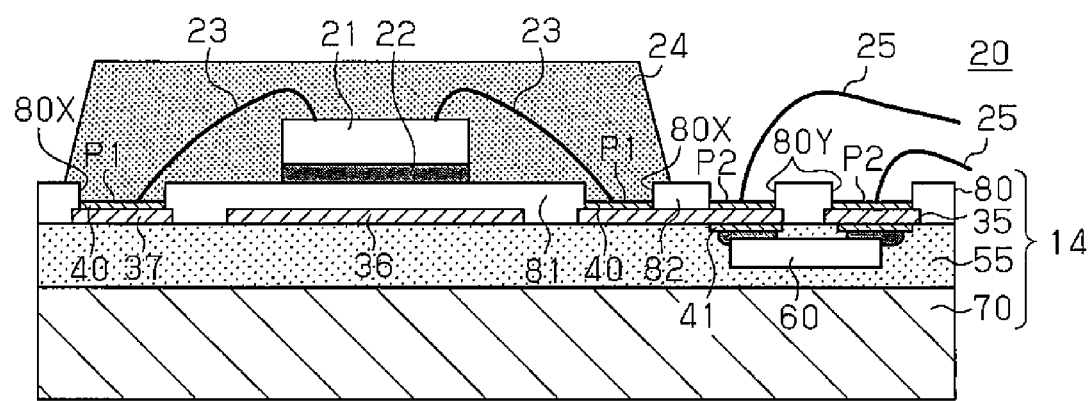
FIG. 11 is a schematic cross-sectional view illustrating a light emitting device using the unit lead frame of FIG. 10.

Referring to FIG. 11, the wires 35 include a wire 36, which is formed in a light emitting element mounting region in which the light emitting element 21 is mounted, and wires 37 formed on opposite sides of the wire 36 as viewed from above.

A plating layer 40 is formed on the upper surface 37A of each wire 37 at a given location. Further, a plating layer 41 is formed on the lower surface 37B of some of the wires (in the present embodiment, two wires 37 located at the right side of the wire 36 in FIG. 11) at given locations. An electronic component 60 is mounted on the lower surface of the plating layer 41.

An insulation layer 55 entirely covers the lower surface of each wire 35, the side surfaces and the lower surface of the plating layer 41, bonding members 61, and the upper, lower, and side surfaces of the electronic component 60. That is, the electronic component 60 is embedded (incorporated) in the insulation layer 55. The insulation layer 55 functions to insulate the wires 35 from a metal plate 70 and functions to adhere the wires 35 to the metal plate 70.

The insulation layer 55 may be formed from, for example, the same material as the insulation layer 50. For example, a resin material formed by mixing a filler of an inorganic material having high thermal conductivity (e.g., silica, alumina, or boron nitride) to an insulative resin such as a polyimide resin or an epoxy resin may be used as the material of the insulation layer 50. In this case, from the viewpoint of thermal conductivity, the content of the filler may be, for example, 50 to 80 vol %. Further, from the viewpoint of the insulation of the wires 35 and the metal plate 70, the thickness from the lower surfaces of the wires 35 to the lower surface of the insulation layer 55 may be, for example, 150 μm to 750 μm. When the insulation layer 55 is highly insulative, from the viewpoint of heat radiation, it is preferred that the insulation layer 55 be thin.

The metal plate 70 entirely covers the lower surface of the insulation layer 55. The metal plate 70 is adhered to the insulation layer 55.

An insulation layer 80 covers the upper surface of each wire 35 and the upper surface 55A of the insulation layer 55. For example, the insulation layer 80 covers the upper surface of each wire 35 and the upper surface 55A of the insulation layer 50 that are not covered by the plating layer 40. The insulation layer 80 includes insulation layers 81 and 82. The insulation layer 81 covers the upper surface of the wire 36, the upper surface 55A of the insulation layer 55 around the wire 36, and the upper surface of the wires 37. The insulation layer 82 covers the insulation layer 55 and the wires 37 that are not covered by the insulation layer 81 and the plating layer 40.

The structure of the light emitting device 20 will now be described.

As illustrated in FIG. 11, the light emitting device 20 includes the wiring substrate 14, one or more light emitting elements 21 mounted on the wiring substrate 14, bonding wires 23, an encapsulation resin 24 that encapsulates the light emitting element 21, the bonding wires 23, and the like, and external connection wires 25.

The light emitting element 21 is wire-bonded to the wiring substrate 14. The encapsulation resin 24 is arranged on the upper surface of the wiring substrate 14 to encapsulate the light emitting element 21, the bonding wires 23, and the like. The external connection wires 25 electrically connect electrode terminals P2 to a mounting substrate (not illustrated).

A method for manufacturing the light emitting device 20 will now be described.

Figure 12A:
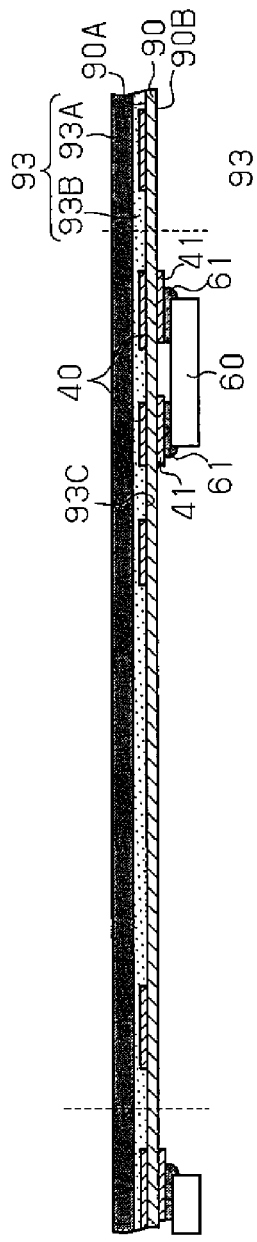
FIGS. 12A to 12C, 13A to 13C, and 14A to 14C are cross-sectional views illustrating a process for manufacturing the light emitting device of the second embodiment.

First, in the step illustrated in FIG. 12A, the same manufacturing steps as those illustrated in FIGS. 5A to 5D are performed to obtain the same structure as that illustrated in FIG. 5D. Then, in the same manner as the step illustrated in FIG. 6C, the electronic component 60 is mounted on the lower surface of the plating layer 41. For example, the bonding members 61 bond the electronic component 60 faced down to the lower surface of the plating layer 41 so that the circuit formation surface (upper surface in FIG. 12A) of the electronic component 60 opposes the plating layer 41.

Figure 12B:
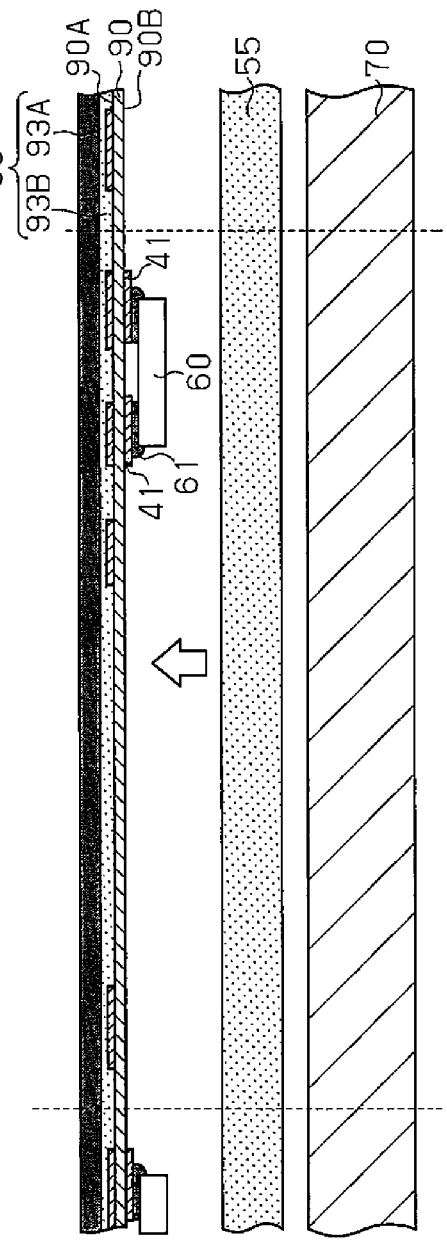
Figure 12C:
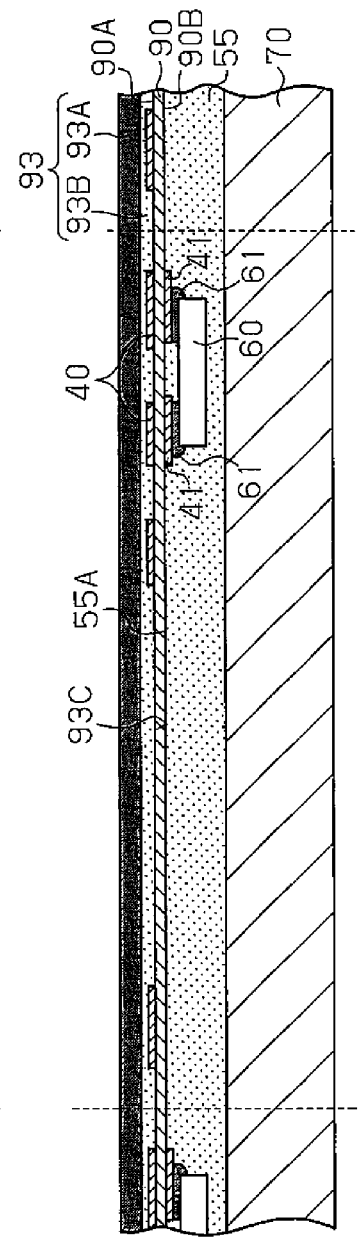

In the steps illustrated in FIGS. 12B and 12C, the plating layer 41, the bonding member 61, and the insulation layer 55 that covers the electronic component 60 are stacked on the lower surface 90B of the conductive substrate 90. Further, the metal plate 70 is stacked on the insulation layer 55. The stacking of the insulation layer 55 and the metal plate 70 is performed, for example, in the same manner as the steps illustrated in FIGS. 7A and 7B.

Further, as illustrated in FIG. 12B, the insulation layer 55 and the metal plate 70 are prepared. In this step, the insulation layer 55 is used in a B-stage (semi-cured condition). Then, as illustrated in FIG. 12B, the insulation layer 55 and the metal plate 70 are sequentially arranged in this order on the lower surface side of the structure illustrated in FIG. 12A. Then, the structure of FIG. 12A, the insulation layer 55, and the metal plate 70 are heated and pressurized in a vacuum atmosphere under a temperature of 80° C. to 200° C. As a result, as illustrated in FIG. 12C, the insulation layer 55 entirely covers the lower surface 90B of the conductive substrate 90, the plating layer 41, the bonding members 61, and the electronic component 60. That is, the plating layer 41, the bonding members 61, and the electronic component 60 are embedded in the insulation layer 55. Then, the insulation layer 55 is cured (thermally hardened) and hardened under a temperature atmosphere of approximately 150° C. The hardening adheres the insulation layer 55 to the conductive substrate 90 and the insulation layer 55 to the metal plate 70. As a result, the insulation layer 55 and the metal plate 70 are stacked on the lower surface 90B of the conductive substrate 90.

Figure 13A:
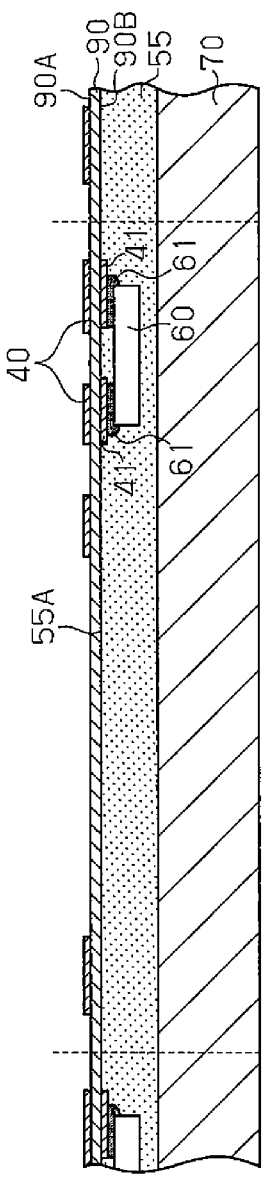

Then, in the step illustrated in FIG. 13A, the tape 93 illustrated in FIG. 12C is removed from the conductive substrate 90. In this stage, there may be residues of some of the adhesive agent 93B (refer to FIG. 12C) of the removed tape 93 on the upper surface 90A of the conductive substrate 90. Thus, for example, asking (dry etching using oxygen plasma) or blasting may be performed to remove the residues of the adhesive agent 93B. The removal of the tape 93 exposes the upper surface 90A of the conductive substrate 90 and the plating layer 40.

Figure 13B:
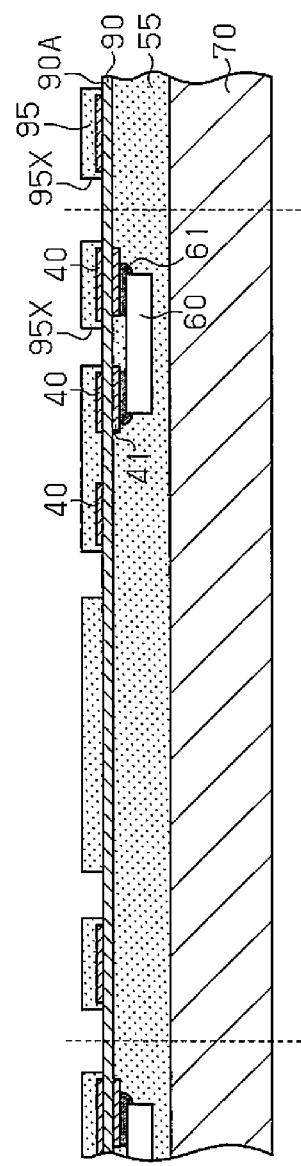

In the step illustrated in FIG. 13B, a resist layer 95 is formed on the upper surface 90A of the conductive substrate 90. The resist layer 95 includes openings 95X shaped in correspondence with the openings 12X. The resist layer 95 may be formed from the same material as the resist layer 94.

Figure 13C:
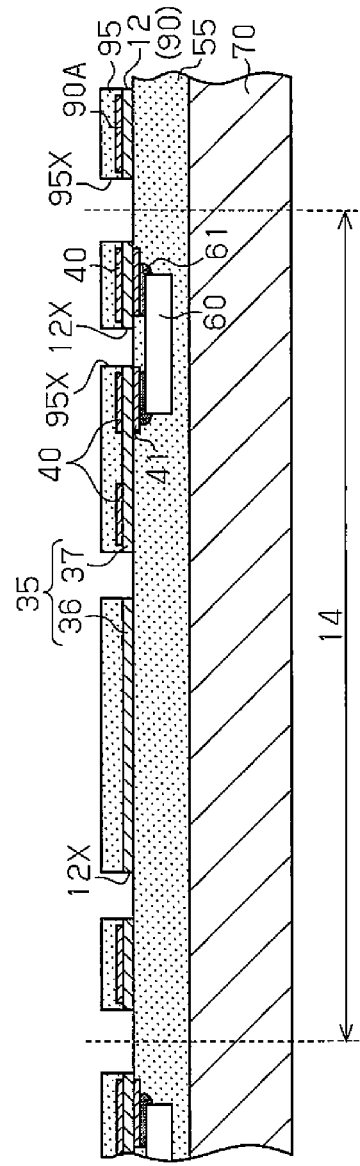

Then, in the step illustrated in FIG. 13C, the conductive substrate 90 is etched from the upper surface 90A using the resist layer 95 as an etching mask to form the substrate frame 12. The conductive substrate 90 exposed from the openings 95X of the resist layer 95 is etched from the upper surface 90A to form the openings 12X in the conductive substrate 90. The formation of the openings 12X defines the wires 35 in each unit lead frame 14.

In this manner, when the conductive substrate 90 is supported by the insulation layer 55 and the metal plate 70, the conductive substrate 90 is patterned to form the substrate frame 12 (wires 35). Thus, even though the etching leaves only the wires 35 and the plating layers 40 and 41, the wires 35 may be held by the insulation layer 55 and the metal plate 70. This allows section bars and support bars that are used in the conventional lead frame to be omitted. Then, for example, an alkali defoliation liquid is used to remove the resist layer 95.

Figure 14A:
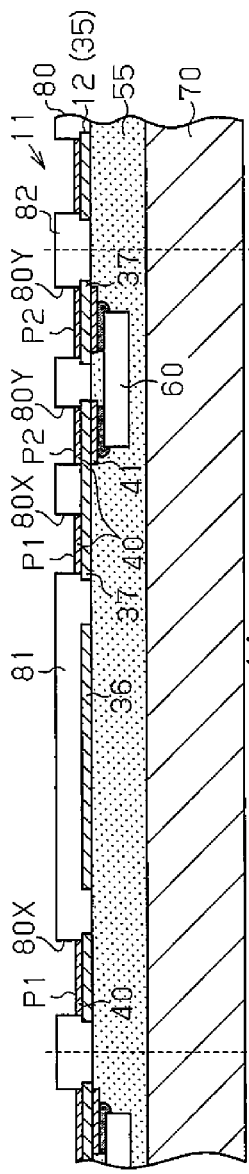

In the step illustrated in FIG. 14A, the insulation layer 80 including the openings 80X and 80Y respectively corresponding to the connection pads P1 and the electrode terminals P2 are formed on the wires 35 and the insulation layer 55. Then, the insulation layer 80 is cured (thermally hardened) and hardened under a temperature atmosphere of approximately 150° C.

The manufacturing steps described above form the structure of a matrix of the unit lead frames 14 (wiring substrates) that are connected to one another (refer to FIG. 10).

Figure 14B:
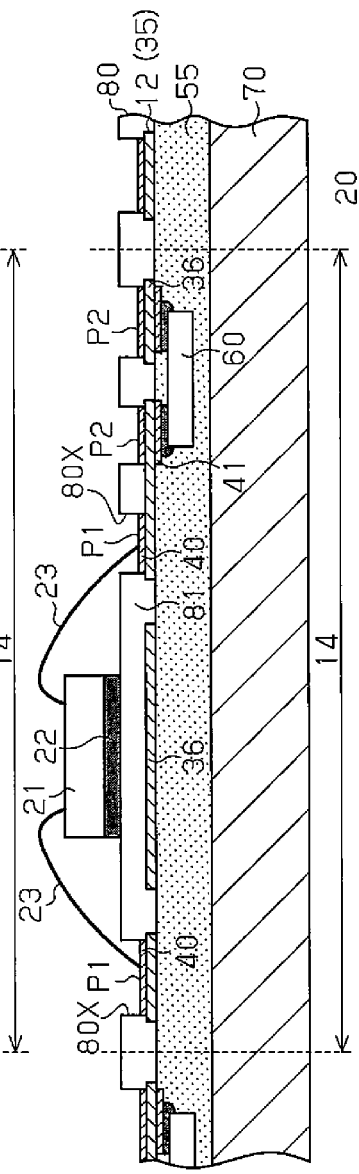

In the step illustrated in FIG. 14B, one or more light emitting elements 21 are wire-bonded to each unit lead frame 14. Then, in the step illustrated in FIG. 14C, the encapsulation resin 24 is formed to encapsulate the light emitting element 21 and the bonding wires 23 that are formed on the unit lead frame 14.

Figure 14C:
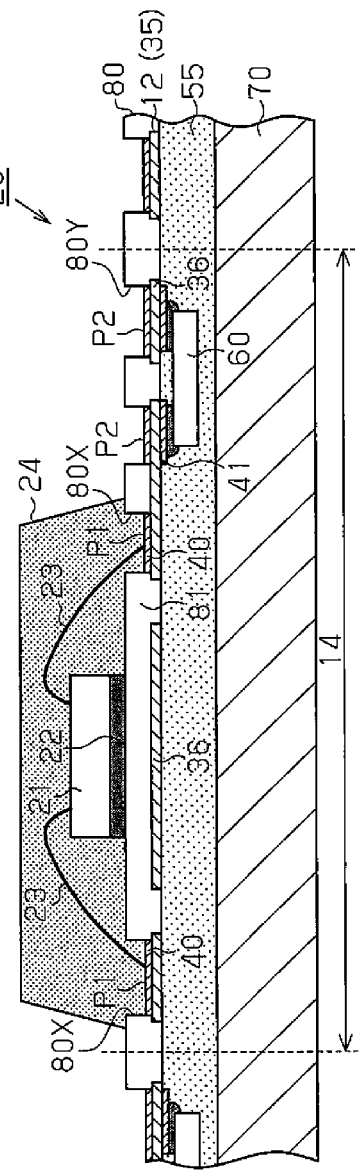

Then, the insulation layers 55 and 80 and the metal plate 70 are cut by a dicing blade or the like at the cutting positions indicated by the broken lines illustrated in FIG. 14C. This manufactures the light emitting devices 20 in a batch with the light emitting elements 21 mounted on the unit lead frame 14. When mounting each light emitting device 20 on a mounting substrate, the external connection wires 25 are connected to the plating layer 40 at locations exposed from the openings 80Y of the insulation layer 80.

The second embodiment has the same advantages as the first embodiment.

Figure 15:
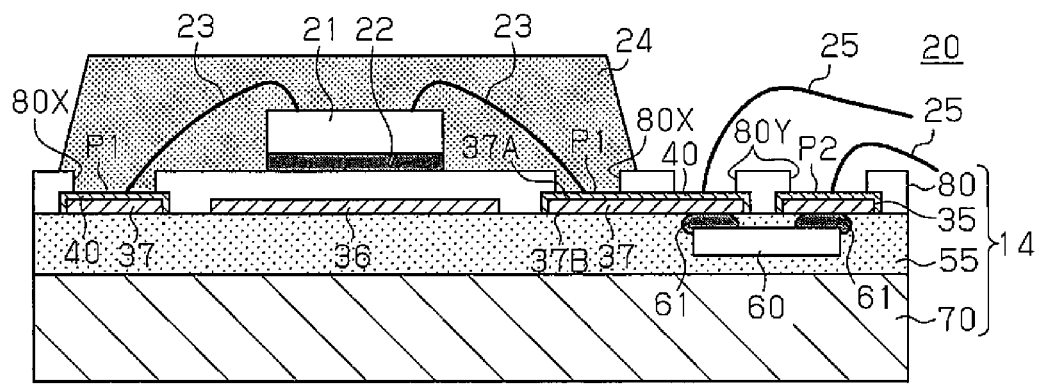
FIG. 15 is a schematic cross-sectional view illustrating a modified example of the light emitting device.

In the second embodiment, the plating layer 40 is formed to partially cover the upper surface 37A of each wire 37. Instead, for example, as illustrated in FIG. 15, the plating layer 40 may be formed to entirely cover the upper surface 37A and side surfaces of each wire 37. In this case, the insulation layer 80 includes the openings 80X and 80Y that expose portions of the upper surface of the plating layer 40 as the connection pads P1 or the electrode terminals P2.

It should be apparent to those skilled in the art that the present invention may be embodied in many other specific forms without departing from the spirit or scope of the invention. Particularly, it should be understood that the present invention may be embodied in the following forms.

In each of the above embodiments, the plating layer 41 may be omitted. In this case, for example, as illustrated in FIG. 15, the bonding members 61 may be used to mount the electronic component 60 on the lower surface 37B of the wires 37 (lower surfaces 32B of wires 32 in FIG. 2A).

Figure 16:
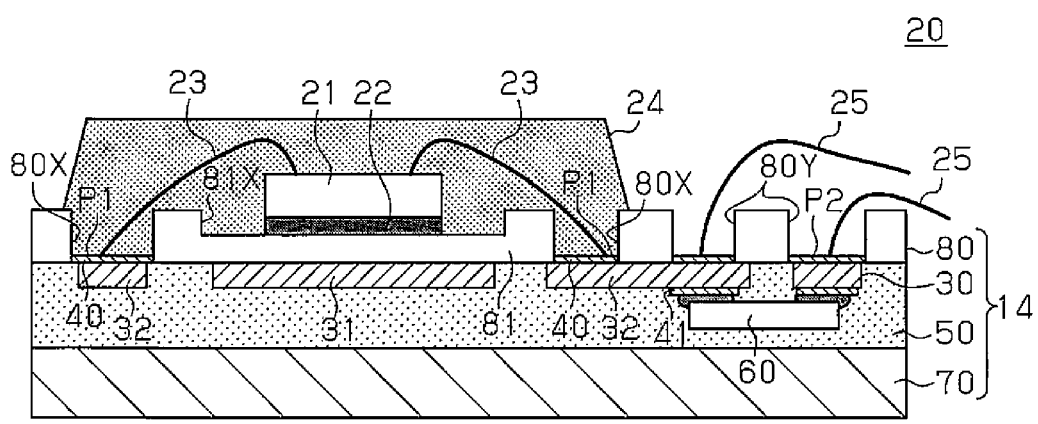
FIG. 16 is a schematic cross-sectional view illustrating a further modified example of the light emitting device.

In each of the above embodiments, the shape of the insulation layer 81 is not particularly limited. For example, as illustrated in FIG. 16, a recess 81X may be formed in the upper surface of the insulation layer 81. The recess 81X is formed from the upper surface of the insulation layer 81 to an intermediate position of the insulation layer 81 in the thicknesswise direction. That is, the recess 81X includes a bottom surface at an intermediate position in the thicknesswise direction of the insulation layer 81. In this structure, the light emitting element 21 may be mounted on the bottom surface of the recess 81X. This forms the insulation layer 81, which has high reflectivity, around the light emitting element 21. Thus, the light emitting efficiency of the light emitting device 20 may be improved.

The wires 31 and 36 may be omitted from the light emitting device 20 and the wiring substrate 14 of each of the above embodiments. In such a structure, the heat of the light emitting element 21 may be released from the wires 30 through the insulation layer 81. This prolongs the life and improves the light emitting efficiency of the light emitting element 21.

In each of the above embodiments and modified examples, the light emitting element 21 is mounted on the insulation layer 81. However, the light emitting element 21 may be mounted on a member that differs from the insulation layer 81.

Figure 17A:
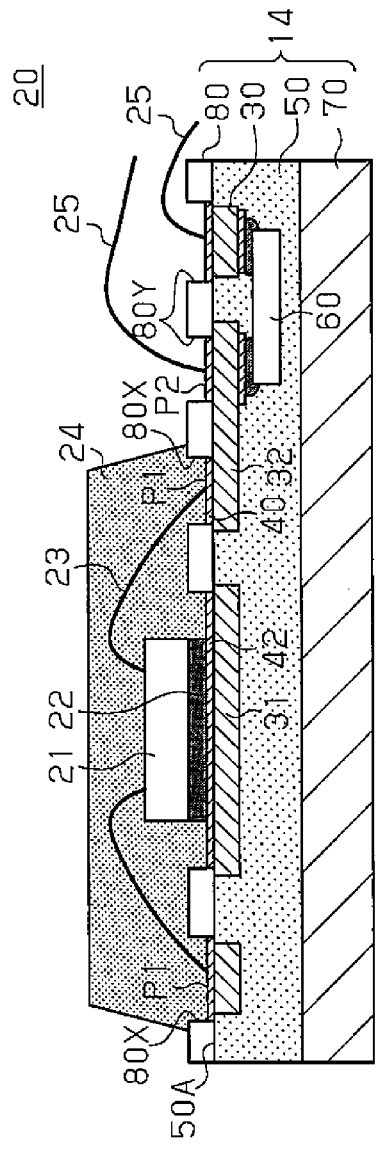
FIGS. 17A and 17B are schematic cross-sectional views illustrating modified examples of the light emitting device.

For example, as illustrated in FIG. 17A, a plating layer 42 similar to the plating layer 40 may be formed on the wires 31, and the light emitting element 21 may be mounted on the plating layer 42. Alternatively, for example, an adhesive agent 22 may be used to adhere the light emitting element 21 to the plating layer 42.

The insulation layer 81 and the plating layer 42 may be omitted, and the light emitting element 21 may be directly mounted on a wire 31. Alternatively, the plating layer 42 and the wire 31 may be omitted from the wiring substrate 14 illustrated in FIG. 17A, and the light emitting element 21 may be directly mounted on the upper surface 50A of the insulation layer 50.

In each of the above embodiments and modified examples, the electronic component 60 is arranged at a position that is not overlapped with the light emitting element 21 as viewed from above. However, the location of the electronic component 60 is not particularly limited.

Figure 17B:
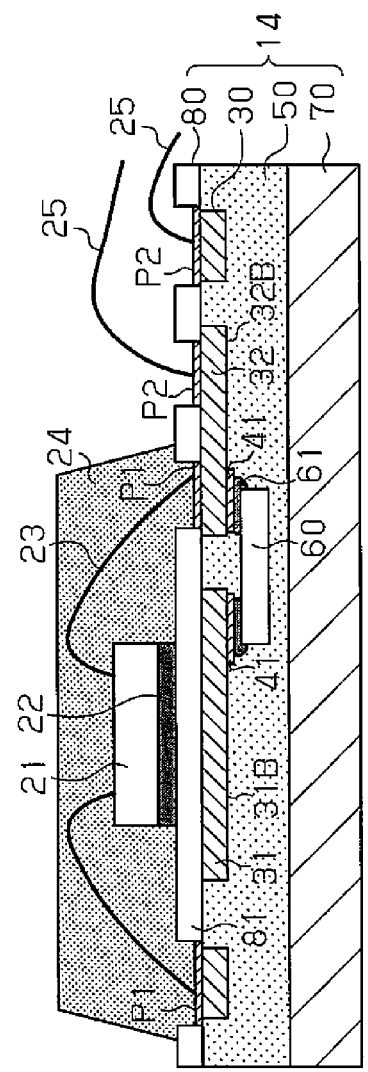

For example, as illustrated in FIG. 17B, at least a portion of the electronic component 60 may be overlapped, as viewed from above, with the light emitting mounting region (e.g., light emitting element 21 and/or connection pad P1). In this case, the plating layer 41 is formed at given locations on the lower surfaces 31B and 32B of the wires 31 and 32. The electronic component 60 is mounted on the lower surface of the plating layer 41. In this case, although not illustrated in the drawings, the wires 31 are electrically connected to the wires 32, the light emitting element 21, and the like where the plating layer 41 is not formed.

In each of the above embodiments, at least a portion of the electronic component 60 is arranged at a position overlapped with the electrode terminals P2 as viewed from above. However, the location of the electronic component 60 is not particularly limited.

Figure 18A:
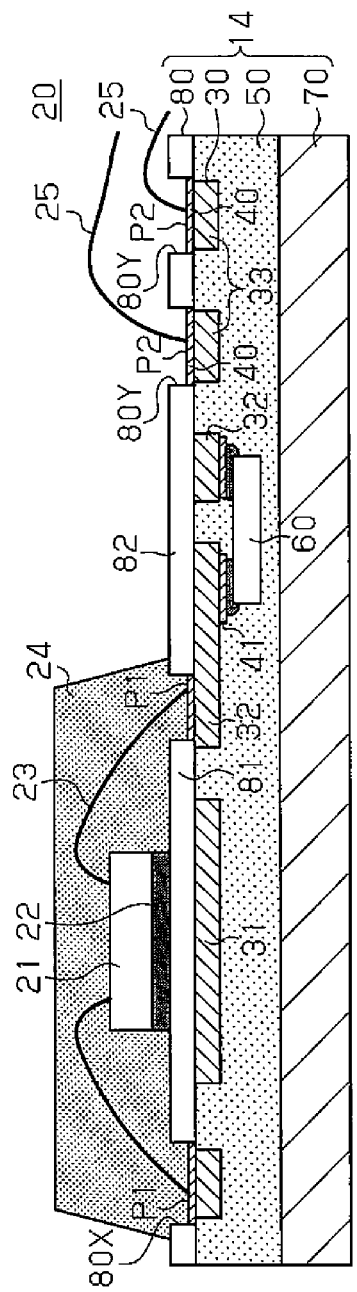
FIGS. 18A and 18B are schematic cross-sectional views illustrating modified examples of the light emitting device.

For example, referring to FIG. 18A, the electronic component 60 may be arranged at a position that is not overlapped with the electrode terminals P2 as viewed from above. In this case, for example, the wires 33 are formed at the outer side of the wires 32 on which the electronic component 60 is mounted, and the plating layer 40 that forms the electrode terminal P2 is formed on the upper surfaces of the wires 33. Further, in this case, for example, the upper surfaces of the wires 32, on which the plating layer 41 is formed, is covered by the insulation layer 82.

Figure 18B:
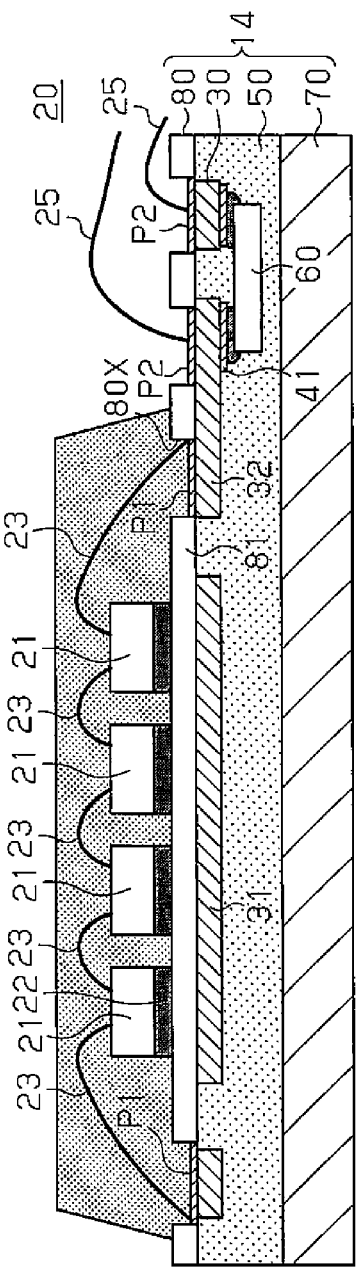

As illustrated in FIG. 18B, a plurality of (four in this example) light emitting elements 21 may be mounted on the insulation layer 81. In this example, the electrodes (not illustrated) of the outermost light emitting elements 21 on the insulation layer 81 are electrically connected to the connection pads P1 by the bonding wires 23. The electrodes of adjacent light emitting elements 21 are electrically connected by bonding wires 23. The connection of the light emitting elements 21 mounted on the insulation layer 81 is not limited to the series connection illustrated in FIG. 18B and may be a parallel connection or a combination of a series connection and a parallel connection.

In the above embodiments, the light emitting element 21 is wire-bonded to each unit lead frame 14. Then, the unit lead frames 14 (light emitting devices 20) are separated from one another. Instead, for example, the light emitting element 21 may be wire-bonded to each unit lead frame 14 after obtaining each unit lead frame 14.

In each of the above embodiments, the lead frame 11 includes a matrix of the unit lead frames 14 that are connected to one another. However, the lead frame 11 may include a plurality of unit lead frames 14 connected in a strip. That is, as long as a lead frame includes a plurality of connected unit lead frames, the arrangement of the unit lead frames is not particularly limited.

The lead frame 11 in each of the above embodiments may be applied to, for example, a surface mounting type package in which external connection terminals are exposed from a surface of a package, such as a ball grid array (BGA), a land grid array (LGA), and a chip size package (CSP).

In each of the above embodiments, the wires 30 and 35 and the portions (patterns) of the plating layer 40 do not have to be tetragonal as viewed from above. For example, the wires 30 and 35 and the portions of the plating layer 40 may be polygonal, for example, triangular or pentagonal, or a polygon having more sides than a pentagon. Alternatively, the wires 30 and 35 and the portions of the plating layer 40 may be circular.

In each of the above embodiments, the openings 80X and 80Y in the insulation layer 80 do not have to be tetragonal as viewed from above. For example, the openings 80X and 80Y may be polygonal, for example, triangular or pentagonal. The openings 80X and 80Y may be a polygon having more sides than a pentagon. Alternatively, the openings 80X and 80Y may be circular.

In each of the above embodiments, the wiring substrate 14 and the light emitting device 20 do not have to be tetragonal as viewed from above. For example, the wiring substrate 14 and the light emitting device 20 may be polygonal, for example, triangular or pentagonal. The wiring substrate 14 and the light emitting device 20 may be a polygon having more sides than a pentagon. Alternatively, the wiring substrate 14 and the light emitting device 20 may be circular.

In each of the above embodiments, instead of the light emitting element 21, for example, a light emitting element sub-mount may be wire-bonded to the wiring substrate 14. The light emitting element sub-mount has a structure in which, for example, a light emitting element is mounted on a sub-mount substrate formed from a ceramic or the like, a reflection plate is arranged around the light emitting element, and the light emitting element is encapsulated in an encapsulation resin.

In each of the above embodiments, the light emitting element 21 is wire-bonded to the wiring substrate 14. Instead, for example, the light emitting element 21 may be flip-chip mounted on the wiring substrate 14.

CLAUSES

This disclosure further encompasses various embodiments described below.

1. A method for manufacturing a wiring substrate, the method including:
performing electrolytic plating on a conductive substrate to form a plating layer where a first surface of each of a plurality of wires is formed in the conductive substrate;
mounting an electronic component on a second surface of each of the wires, the second surface of each of the wires being located on an opposite side of the first surface of each of the wires;
forming an insulation layer that covers the electronic component and the second surface of each of the wires; and
forming a reflection layer on the insulation layer and the first surface of each of the wires, wherein the reflection layer includes an opening that exposes at least a portion of the plating layer as a connection pad.

2. A method for manufacturing a wiring substrate, the method including:
performing electrolytic plating on a conductive substrate to form a plating layer on a first surface of the conductive substrate;
applying a tape to the first surface of the conductive substrate and the plating layer;
forming an opening in the conductive substrate to define a plurality of wires;
mounting an electronic component on a second surface of the conductive substrate that is located on an opposite side of the first surface of the conductive substrate;
filling the opening with an insulation layer that covers the electronic component and the second surface of the conductive substrate;
removing the tape to expose a first surface of each of the wires and a first surface of the insulation layer; and
forming a reflection layer on the first surface of each of the wires and the first surface of the insulation layer, wherein the reflection layer includes an opening that exposes at least a portion of the plating layer as a connection pad.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a metal plate arranged as a lowermost layer of the wiring substrate and including an exposed lower surface;
an insulation layer formed entirely on an upper surface of the metal plate and including a plurality of recesses;
a reflection layer arranged on the insulation layer;
a plurality of separated wires embedded in the recesses of the insulation layer, wherein each of the wires includes an upper surface, a lower surface, and a side surface, the upper surface of each wire is at a same level as a lowermost surface of the reflection layer, the entire lower surface of each wire and the entire side surface of each wire are covered by the insulation layer;
a first plating layer formed on an upper surface of each of the wires, wherein the reflection layer includes a first opening that exposes at least a portion of the first plating layer as a connection pad; and
an electronic component mounted on the lower surface of each of the wires, wherein the electronic component is embedded in the insulation layer;
wherein the electronic component is separated from the metal plate so that the insulation layer lies between the electronic component and the metal plate and so that the electronic component is located between the lower surface of each of the wires and the upper surface of the metal plate.

2. The wiring substrate according to claim 1, further comprising:
a second plating layer formed on the lower surface of each of the wires; and
a conductive bonding member that bonds the electronic component to the second plating layer so that the bonding member and the second plating layer electrically connects the electronic component to the wires.

3. The wiring substrate according to claim 1, wherein the reflection layer further includes a second opening that exposes at least another portion of the first plating layer as an electrode terminal, and
the electronic component is located at a position overlapped with the electrode terminal as viewed from above.

4. The wiring substrate according to claim 1, wherein the electronic component is located at a position overlapped with the connection pad as viewed from above.

5. The wiring substrate according to claim 1, wherein the metal plate covers a lower surface of the insulation layer that is located on an opposite side of an upper surface of the insulation layer.

6. The wiring substrate according to claim 1, wherein the reflection layer has a reflectivity of 50% or greater in a wavelength of 450 nm to 700 nm.

7. The wiring substrate according to claim 1, wherein the insulation layer includes an uppermost surface that is at a same level as the upper surface of each wire.

8. The wiring substrate according to claim 1, wherein the insulation layer includes an uppermost surface that is at a same level as the upper surface of the first plating layer.

9. A light emitting device comprising:
a wiring substrate including
a metal plate arranged as a lowermost layer of the wiring substrate and including an exposed lower surface,
an insulation layer formed entirely on an upper surface of the metal plate and including a plurality of recesses,
a reflection layer arranged on the insulation layer,
a plurality of separated wires embedded in the recesses of the insulation layer, wherein each of the wires includes an upper surface, a lower surface, and a side surface, the upper surface of each wire is at a same level as a lowermost surface of the reflection layer, the entire lower surface of each wire and the entire side surface of each wire are covered by the insulation layer,
a first plating layer formed on an upper surface of each of the wires, wherein the reflection layer includes a first opening that exposes at least a portion of the first plating layer as a connection pad, and an electronic component mounted on the lower surface of each of the wires, wherein the electronic component is embedded in the insulation layer, wherein the electronic component is separated from the metal plate so that the insulation layer lies between the electronic component and the metal plate and so that the electronic component is located between the lower surface of each of the wires and the upper surface of the metal plate; and a light emitting element mounted on the wiring substrate and electrically connected to the connection pad.

10. The light emitting device according to claim 9, wherein the insulation layer includes an uppermost surface that is at a same level as the upper surface of each wire.

11. The light emitting device according to claim 9, wherein the insulation layer includes an uppermost surface that is at a same level as the upper surface of the first plating layer.

* * * * *